(12) United States Patent
Yun et al.

(10) Patent No.: US 12,740,122 B2
(45) Date of Patent: Sep. 15, 2026

(54) SEMICONDUCTOR DEVICE INCLUDING BACKSIDE SOURCE/DRAIN CONTACT STRUCTURE WITH CONTACT SPACER AND BACKSIDE GATE CONTACT STRUCTURE

(71) Applicant: SAMSUNG ELECTRONICS CO., LTD., Suwon-si (KR)

(72) Inventors: Seungchan Yun, Waterford, NY (US); Jason Martineau, Fremont, CA (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 18/380,951

(22) Filed: Oct. 17, 2023

(65) Prior Publication Data

US 2024/0395900 A1 Nov. 28, 2024

Related U.S. Application Data

(60) Provisional application No. 63/468,912, filed on May 25, 2023.

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .... H10D 64/017; H10D 30/014; H10D 30/43; H10D 30/6735; H10D 30/6757;
(Continued)

(56) References Cited

U.S. PATENT DOCUMENTS 10,083,963 B2 9/2018 Goktepeli et al.
10,868,193 B2 12/2020 Sengupta et al.
(Continued)

OTHER PUBLICATIONS

European Extended Search Report issued Oct. 23, 2024 by the European Patent Office for EP Patent Application No. 24173353.4.

*Primary Examiner* — Vu A Vu
(74) *Attorney, Agent, or Firm* — Myers Bigel, P.A.

(57) ABSTRACT

A semiconductor device includes: a $1^{st}$ source/drain region; a $2^{nd}$ source/drain region; a channel structure connecting the $1^{st}$ source/drain region to the $2^{nd}$ source/drain region; a gate structure configured to control the channel structure; a backside source/drain contact structure connected to a bottom surface of the $1^{st}$ source/drain region; a backside isolation structure at a lower portion of the semiconductor device; and a $1^{st}$ contact spacer on the backside source/drain contact structure, wherein the $1^{st}$ contact spacer is configured to isolate the backside source/drain contact structure from another circuit element in the backside isolation structure.

15 Claims, 24 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2025.01) |
| ***H10D 84/03*** | (2025.01) |
| ***H10D 84/83*** | (2025.01) |

(52) U.S. Cl.

CPC ..... *H10D 30/6735* (2025.01); *H10D 30/6757* (2025.01); *H10D 62/116* (2025.01); *H10D 62/121* (2025.01); *H10D 62/151* (2025.01); *H10D 64/021* (2025.01); *H10D 84/013* (2025.01); *H10D 84/0147* (2025.01); *H10D 84/0149* (2025.01); *H10D 84/038* (2025.01); *H10D 84/83* (2025.01)

(58) Field of Classification Search

CPC .. H10D 62/116; H10D 62/121; H10D 62/151; H10D 64/021; H10D 84/013; H10D 84/0147; H10D 84/0149; H10D 84/038; H10D 84/83; H10D 30/0198; H10D 64/251; H10D 84/0151; H10D 84/834; H01L 21/76897; H01L 23/5283; H01L 21/768; H01L 23/5286; H01L 23/535

USPC .......................................................... 257/401

See application file for complete search history.

(56) References Cited

U.S. PATENT DOCUMENTS

| | | | | |
|---|---|---|---|---|
| 11,532,744 | B2 | 12/2022 | Chen et al. | |
| 11,616,143 | B2 | 3/2023 | Chen et al. | |
| 11,699,742 | B2 * | 7/2023 | Chung | H10D 30/6757 257/288 |
| 12,362,004 | B2 * | 7/2025 | Sung | H10D 30/6728 |
| 12,494,428 | B2 * | 12/2025 | Xie | H10D 84/83 |
| 12,495,587 | B2 * | 12/2025 | Cheng | H10D 30/031 |
| 2020/0294998 | A1 | 9/2020 | Lilak et al. | |
| 2021/0074823 | A1 | 3/2021 | Glass et al. | |
| 2021/0375664 | A1 | 12/2021 | Chang et al. | |
| 2022/0216340 | A1 | 7/2022 | Lin et al. | |
| 2022/0271138 | A1 | 8/2022 | Su et al. | |
| 2022/0359679 | A1 * | 11/2022 | Lu | H10D 64/017 |
| 2024/0186219 | A1 * | 6/2024 | Kang | H01L 21/743 |
| 2024/0186374 | A1 * | 6/2024 | Xie | H10D 84/0149 |
| 2024/0321747 | A1 * | 9/2024 | Xie | H10D 30/6757 |
| 2024/0355708 | A1 * | 10/2024 | Huang | H01L 21/76897 |
| 2024/0373654 | A1 * | 11/2024 | Kang | H10B 80/00 |

* cited by examiner

1400
Storage

1500
Buffer RAM
Module

1100
Processors

1200
Communicaiton
Module

1300
I/O Module

SEMICONDUCTOR DEVICE INCLUDING BACKSIDE SOURCE/DRAIN CONTACT STRUCTURE WITH CONTACT SPACER AND BACKSIDE GATE CONTACT STRUCTURE

CROSS-REFERENCE TO RELATED APPLICATION

This application is based on and claims priority from U.S. Provisional Application No. 63/468,912 filed on May 25, 2023 in the U.S. Patent and Trademark Office, the disclosure of which is incorporated herein in its entirety by reference.

BACKGROUND

1. Field

Apparatuses and methods related to the disclosure relate to a semiconductor device in which a backside gate contact structure is formed in a self-aligned manner and a backside source/drain contact structure has a contact spacer thereon.

2. Description of the Related Art

In an effort to reduce the footprint of a semiconductor device including field-effect transistors, a distance between a gate contact structure and a source/drain contact structure has been reduced in manufacturing the semiconductor device. However, as the semiconductor device comes to have an even higher device integration density, the short distance between the gate contact structure and the source/drain contact structure may results in a high risk of a short circuit therebetween.

FIG. 1A illustrates a top plan view of a semiconductor device in which a plurality of gate structures and source/drain regions are formed to constitute respective field-effect transistors. FIG. 1B illustrates a cross-section view of the semiconductor device of FIG. 1A along a line I-I' shown therein in a D1 direction, according to an embodiment. It is to be understood here that the D1 direction is a channel-length direction which intersects a D2 direction, which is a channel-width direction, and a D3 direction which is a vertical direction.

Referring to FIGS. 1A and 1B, a semiconductor device 10 includes $1^{st}$ to $6^{th}$ gate structures G1-G6 and $1^{st}$ to $5^{th}$ source/drain regions SD1-SD5 formed on a substrate 101 with a bottom isolation layer 102 therebetween. The source/drain regions SD1-SD6 are isolated from the gate structures G1-G6 by inner spacers 104, and the gate structures G1-G6 are protected by gate spacers 108 formed on upper side surfaces thereof.

The gate structures G1-G6 are extended in the D2 direction and arranged in the D1 direction. The gate structures G1-G6 surrounds a plurality of nanosheet channel layers 110 forming a channel structure that connects two adjacent source/drain regions to form respective nanosheet transistors. The nanosheet transistor is also referred to as a gate-all-around (GAA) transistor and a multi-bridge channel field-effect transistor (MBCFET). The gate structures G1-G6 may control a current flowing between the two source/drain regions through the channel structure. For example, a $1^{st}$ nanosheet transistor NT1 is formed by the $1^{st}$ source/drain region SD1 and the $2^{nd}$ source/drain region SD2 connected to each other through the channel layers 110 and the gate structure G2 surrounding the channel layers 110 between the two source/drain regions SD1 and SD2. Similarly, a $2^{nd}$ nanosheet transistor NT2 is formed by the $4^{th}$ source/drain region SD4 and the $5^{th}$ source/drain region SD5 connected to each other through the channel layers 110 and the gate structure G5 surrounding the channel layers 110 between the two source/drain regions SD4 and SD5.

The semiconductor device 10 further includes $1^{st}$ to $5^{th}$ source/drain contact structure CA1-CA5 formed on top surfaces of the $1^{st}$ to $5^{th}$ source/drain regions SD1-SD5, respectively, to connect these source/drain regions to a voltage source or another circuit element inside or outside the semiconductor device 10. The semiconductor device 10 also includes a $1^{st}$ gate contact structure CB1 and a $2^{nd}$ gate contact structure CB2 formed on top surfaces of the $2^{nd}$ gate structure G2 and the $5^{th}$ gate structure G5, respectively, to receive and deliver gate input signals to these gate structures. The contact structures CA1-CA5 are isolated from each other and from the gate structures CB1 and CB2 through an isolation structure 116.

However, as a distance DT1 between the $1^{st}$ gate contact structure CB1 and each of the adjacent source/drain contact structures CA1 and CA2 becomes smaller in the semiconductor device 10, there is an increased risk of a short circuit therebetween. There also exists the same short-circuit risk between the $5^{th}$ gate contact structure CB5 and each of the adjacent source/drain contact structures CA4 and CA5.

In the semiconductor device 10, the substrate 101 may be a silicon substrate or a silicon-on-insulator (SOI), not being limited thereto. The channel layers 110 may be formed of silicon (Si) or silicon germanium (SiGe). The gate structures G1-G6 may be formed of one or more materials including, for example, copper (Cu), aluminum (Al), cobalt (Co), tungsten (W), titanium (Ti), tantalum (Ta) or their combination. The source/drain regions SD1-SD5 may include one or more materials, for example, silicon (Si), silicon germanium (SiGe) doped with impurities. The contact structures CA1-CA5, CB1 and CB2 may be formed of one or more materials such as copper (Cu), aluminum (Al), tungsten (W), ruthenium (Ru), molybdenum (Mo), etc. The bottom isolation layer 102 suppressing a leakage current from the gate structures G1-G6 and the source/drain regions SD1-SD5 may be formed a material such as silicon oxide (e.g., $SiO_2$), not being limited thereto. One or more materials forming the bottom isolation layer 102, the inner spacers 104 and the gate spacers 108 may include, for example, silicon oxide (e.g., $SiO_2$) or silicon nitride ($Si_3N_4$). The isolation structure 116 may be formed of, for example, silicon oxide (e.g., SiO or $SiO_2$).

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a semiconductor device which includes a backside source/drain contact structure with a contact spacer thereon and a backside gate contact structure isolated from the backside source/drain contact structure by the contact spacer.

According to an embodiment, there is provided a semiconductor device which may include: a $1^{st}$ source/drain region; a $2^{nd}$ source/drain region; a channel structure connecting the $1^{st}$ source/drain region to the $2^{nd}$ source/drain region; a gate structure configured to control the channel structure; a backside source/drain contact structure connected to a bottom surface of the 1$^{st}$ source/drain region; a backside isolation structure at a lower portion of the semiconductor device; and a 1$^{st}$ contact spacer on the backside source/drain contact structure, wherein the 1$^{st}$ contact spacer is configured to isolate the backside source/drain contact structure from another circuit element in the backside isolation structure.

The 1$^{st}$ contact spacer may be foremd on a side surface of the backside source/drain contact structure, and include an isolatin material, and the semiconductor device may further include a backside gate contact structure connected to a bottom surface of the gate structure.

According to an embodiment, there is provided a semiconductor device which may include: a 1$^{st}$ source/drain region; a 2$^{nd}$ source/drain region; a channel structure connecting the 1$^{st}$ source/drain region to the 2$^{nd}$ source/drain region; a gate structure configured to control the channel structure; and a backside gate contact structure connected to a bottom surface of the gate structure, wherein the backside gate contact structure is misligned with the bottom surface of the gate structure to be closer to the 2$^{nd}$ source/drain region than the 1$^{st}$ source/drain region The semiconductor device may further include: a backside source/drain contact structure connected to a bottom surface of the 1$^{st}$ source/drain region; and a 1$^{st}$ contact spacer on the backside source/drain contact structure, the 1$^{st}$ contact spacer configured to isolate the backside source/drain contact structure from another circuit element in the backside isolation structure.

According to embodiments, there is provided a method of manufacturing a semiconductor device. The method may include: forming a placeholder structure on a bottom surface of a source/drain region; forming a contact spacer on the placeholder structure; forming a backside gate contact structure on a bottom surface of a gate structure; and replacing the placeholder structure with a backside source/drain contact structure such that the backside source/drain contact structure is surrounded by the contact spacer.

BRIEF DESCRIPTION OF DRAWINGS

Example embodiments of the disclosure will be more clearly understood from the following detailed description taken in conjunction with the accompanying drawings in which:

FIG. 1A illustrates a top plan view of a semiconductor device in which a plurality of gate structures and source/drain regions are formed to constitute respective field-effect transistors;

FIG. 1B illustrates a cross-section view of the semiconductor device of FIG. 1A along a line I-I' shown therein in a D1 direction, according to an embodiment;

FIG. 7 is a schematic block diagram illustrating an electronic device including at least one of the semiconductor devices shown in FIGS. 2 and 3, according to embodiments.

DETAILED DESCRIPTION OF EXAMPLE EMBODIMENTS

Figure 2:
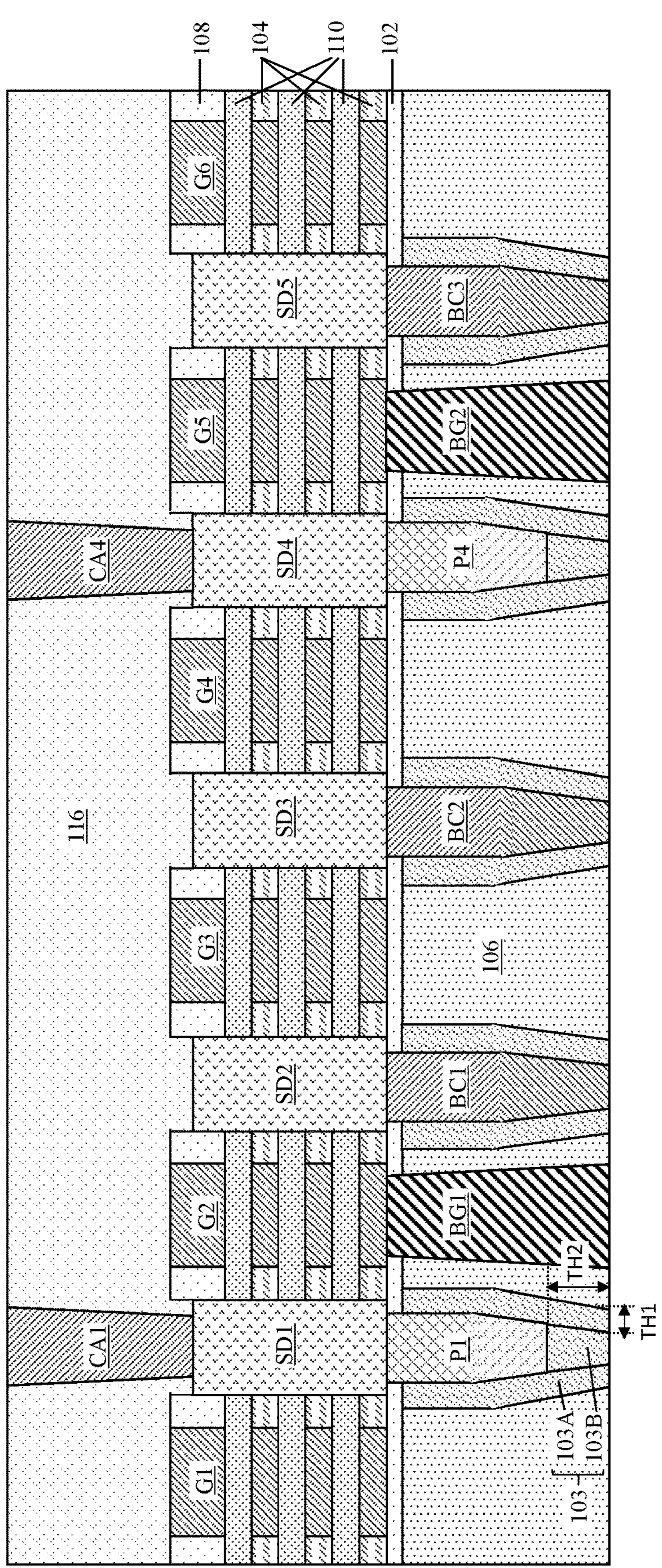
FIG. 2 illustrates a semiconductor device including a backside source/drain contact structure and a backside gate contact structure, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "1$^{st}$" element or a "2$^{nd}$" element, respectively, as long as their structural relationship is clearly understood in the context of the descriptions. Similarly, the terms a "lower" element and an "upper" element may be respectively referred to as a "1$^{st}$" element and a "2$^{nd}$" element with necessary descriptions to distinguish the two elements.

It will be understood that, although the terms "1$^{st}$," "2$^{nd}$," "3$^{rd}$," "4$^{th}$," "5$^{th}$," "6$^{th}$," etc. may be used herein to describe various elements, these elements should not be limited by these terms. These terms are only used to distinguish one element from another element. Thus, a 1$^{st}$ element discussed below could be termed a 2$^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Further, when a term "coplanar" or "aligned" is used to compare a positional relationship between two or more elements, the term may also cover "a substantially coplanar" or "substantially alighted" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity. Thus, it is to be understood that such schematic illustrations may not reflect actual images when any of the structures described herein are examined through scanning electron microscopy (SEM), transmission electron microscopy (TEM), focused ion beam (FIB) microscopy, etc.

For the sake of brevity, conventional elements, structures or layers of semiconductor devices including a nanosheet transistor, a fin field-effect transistor, and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments.

A backside power distribution network (BSPDN) for a semiconductor device has been introduced to address a heavy traffic of signal lines and power rails at a front side of the semiconductor device. The BSPDN may also contribute to reducing contact resistance between circuit elements formed at the front side of the semiconductor device. Here, the front side refers to a side where a transistor is formed with respect to a top surface of a substrate, and the back side refers to a side opposite to the front side. The BSPDN is formed on a back side of a semiconductor device, and may include backside metal lines, such as a buried power rail, and backside source/drain contact structures formed on bottom surfaces of source/drain regions of a field-effect transistor such as a nanosheet transistor or a fin field-effect transistor (FinFET), and the backside metal lines may connect the backside contact structures to a voltage source or another circuit element for signal routing.

In the embodiments described below, the BSPDN is expanded to include a backside gate contact structure to address a short-circuit risk between a gate contact structure formed at a front side of a semiconductor device and other circuit elements such as source/drain contact structures also formed on the front side of the semiconductor device.

FIG. 2 illustrates a semiconductor device including a backside source/drain contact structure and a backside gate contact structure, according to an embodiment.

Figure 1A:
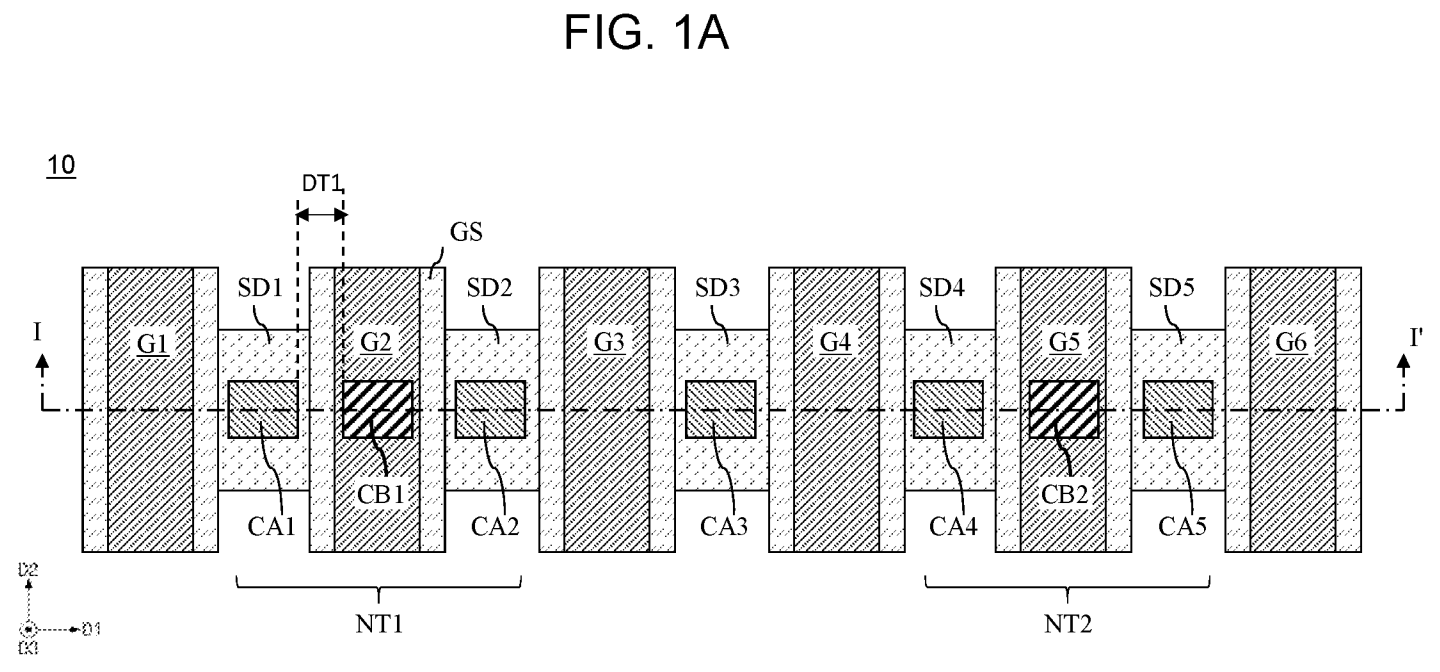
Figure 1B:
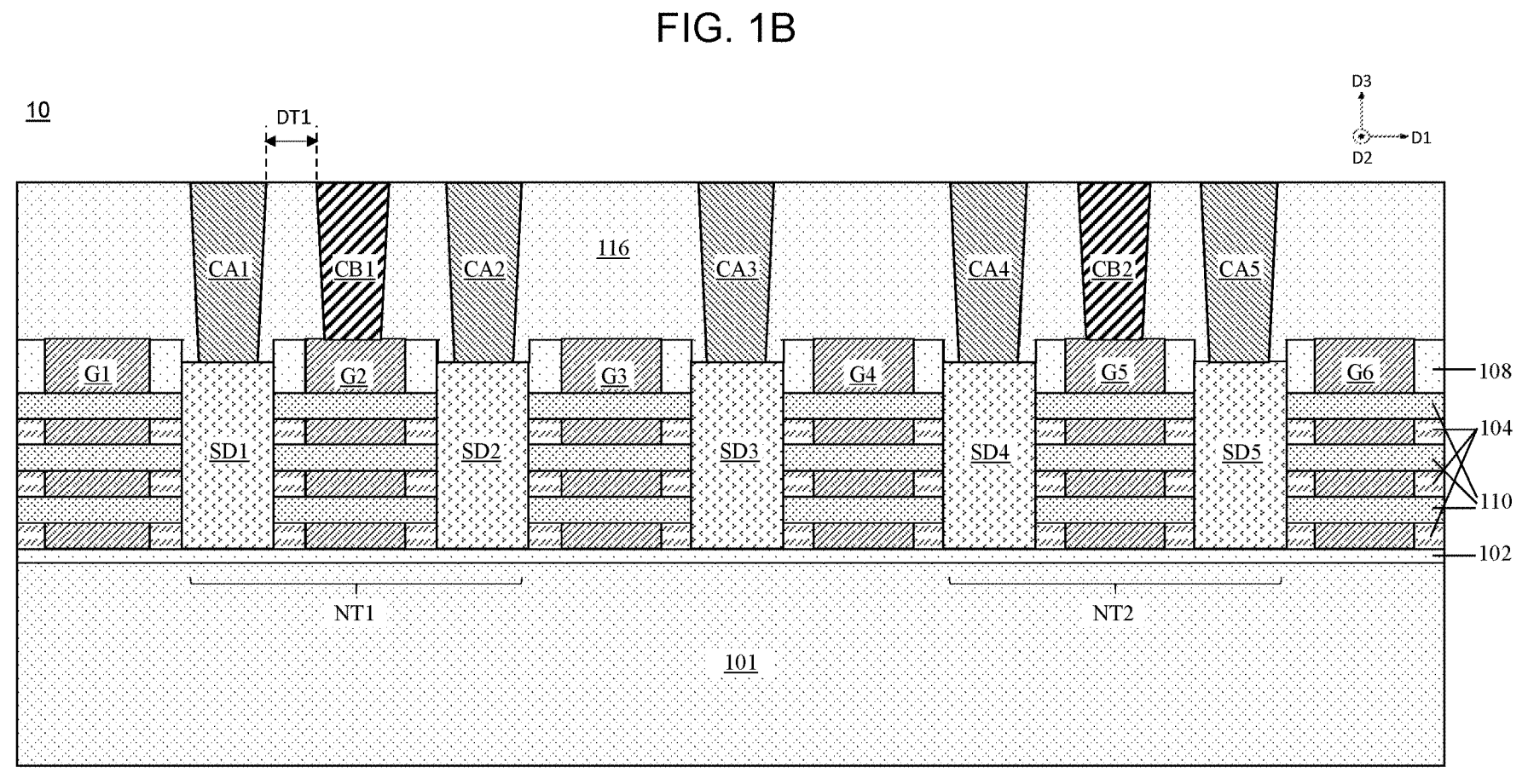

Referring to FIG. 2, a semiconductor device 20 may include the same structural elements of the semiconductor device 10 shown in FIGS. 1A and 1B, such as the source/drain regions SD1-SD6, the gate structure G1-G5, the channel layers 110, the inner spacers 104, the gate spacers 108, and the isolation structure 116. However, the semiconductor device 20 may include contact structures different from those of the semiconductor device 10. Thus, while duplicate descriptions thereof may be omitted, the differences of the semiconductor device 20 are described herebelow.

In the semiconductor device 20, some selected source/drain contact structures and gate contact structures may be formed on a back side while the other contact structures remain on a front side. For example, 1$^{st}$ to 3$^{rd}$ backside source/drain contact structures BC1-BC3 may be formed on bottom surfaces of the 2$^{nd}$, 3$^{rd}$ and 5$^{th}$ source/drain regions SD2, SD3 and SD5, respectively, and surrounded by a contact spacer 103. Further, 1$^{st}$ and 2$^{nd}$ backside gate contact structures BG1 and BG2 may be formed on bottom surfaces of the 2$^{nd}$ and 5$^{th}$ gate structures G2 and G5, respectively. Still, the 1$^{st}$ and 4$^{th}$ source/drain contact structures CA1 and CA4 may be formed on the top surfaces of the 1$^{st}$ and 4$^{th}$ source/drain regions SD1 and SD4, respectively. These backside contact structures BC1-BC3, BG1 and BG2 of the semiconductor device 20 may be formed of the same material(s) forming the channel structures CA1-CA5, CB1 and CB2 of the semiconductor device 10, which are frontside contact structures herein.

The backside contact structures BC1-BC3, BG1 and BG2 may be buried in a backside isolation structure 106, and bottom surfaces thereof are exposed through a bottom surface of the backside isolation structure 106. The backside isolation structure 106 may have replaced the substrate 101 in a backside process to form a BSPDN of the semiconductor device 20, as will be described later in reference to FIGS. 4A-4O. Similar to the isolation structure 116, which is a frontside isolation structure, the backside isolation structure 106 may be formed of, for example, silicon oxide (e.g., SiO or $SiO_2$).

Although not shown in the drawings, one or more backside metal lines may be formed on the back side of the semiconductor device 20 to be connected to the backside gate contact structures BG1 and BG2 to deliver respective gate input signals or a common gate input signal to the gate structures G2 and G5 through the backside gate contact structures BG1 and BG2, respectively. Also, another one or more backside metal lines may be formed on the back side of the semiconductor device 20 to be connected to the backside source/drain contact structures BC1-BC3 to connect the source/drain regions SD2, SD3 and SD5 to one or more voltage sources or other circuit elements though the backside source/drain contact structures BC1-BC3, respectively.

When the selected contact structures are formed at the back side instead of the front side as described herein, congestion of the contact structures and interconnects, and increased contact resistances at the front side of the semiconductor device 20 may be reduced as described earlier. Moreover, when the $1^{st}$ backside gate contact structure BG1 is formed to be sufficiently distant from the $1^{st}$ source/drain contact structure CA1 as described herein, a short-circuit risk between these two contact structures may be removed. Similarly, a short-circuit risk between the $2^{nd}$ backside gate contact structure BG2 and the $4^{th}$ source/drain contact structure CA4 may also be removed.

The semiconductor device 20 may also include a $1^{st}$ placeholder structure P1 formed on a bottom surface of the $1^{st}$ source/drain region SD1, and a $4^{th}$ placeholder structure P4 formed on a bottom surface of the $4^{th}$ source/drain region SD4. The placeholder structures P1 and P4 may be formed of a material including silicon germanium (SiGe) or silicon oxide (e.g., SiO, $SiO_2$, etc.), not being limited thereto. The placeholder structures P1 and P4 may have been formed to reserve spaces for formation of backside source/drain contact structures and remained in the semiconductor device 20, because the $1^{st}$ and $4^{th}$ source/drain contact structures, instead of being formed as backside source/drain contact structures, may have been formed on the $1^{st}$ and $4^{th}$ source/drain regions SD1 and SD4, respectively, before the backside process for the semiconductor device 20 began. However, $2^{nd}$, $3^{rd}$ and $5^{th}$ placeholder structures P2, P3 and P5 formed along with the $1^{st}$ and $4^{th}$ placeholder structures P1 and P4 were replaced by the backside source/drain contact structures BC1-BC3 in the same backside process.

Although the current embodiment of the semiconductor device 20 includes the placeholder structures P1 and P5, the semiconductor device 20 may be configured not to include these two placeholder structures, according to another embodiment. This is because the corresponding frontside source/drain channel structures CA1 and CA4 are formed to connect the $1^{st}$ and $4^{th}$ source/drain regions to a voltage source or other circuit elements, and thus, no backside source/drain contact structures are needed to replace the placeholder structures P1 and P5.

In addition to the backside contact structures BC1-BC3, BG1 and BG3 along with the placeholder structures P1 and P4, the semiconductor device 20 further includes the contact spacer 103 as briefly described earlier. The contact spacer 103 may include a side spacer 103A and a bottom spacer 103B which surround each of the backside source/drain contact structures BC1-BC3 and the placeholder structures P1 and P4.

The side spacer 103A may be formed on a side surface of each of the backside source/drain contact structures BC1-BC3 and the placeholder structures P1 and P4 except a small upper portion which contacts the bottom isolation layer 102. In contrast, the bottom spacer 103B may be formed on a bottom surface of each of the placeholder structures P1 and P4, and surrounded by the side spacer 103A. However, the bottom spacer 103B may also have been formed at a corresponding position and surrounded by the side spacer 103A on the side surface of each of the backside source/drain contact structures BC1-BC3 prior to the formation of the backside source/drain contact structures BC1-BC3. However, such bottom spacers 103B may have been removed to form the backside source/drain contact structures BC1-BC3 during the backside process for the semiconductor device 20, as will be described later. With the above structural formation of the backside contact structures BC1-BC3, BG1 and BG2 along with the side spacer 103A and the bottom spacer 103B, bottom surfaces thereof may be coplanar with each other.

The contact spacer 103 may be formed of one or more materials including silicon nitride (e.g., SiN, SiBCN, SiOCN, etc.) to provide an additional or back-up isolation profile to the backside of the semiconductor device 20.

The side spacer 103A and the bottom spacer 103B may have been formed at different steps in the backside process as will be described later. Thus, there may exist a boundary, a connection surface, or a contact surface between the side spacer 103A and the bottom spacer 103B even though they are formed of the same material. According to another embodiment, the side spacer 103A and the bottom spacer 103B may be formed of different silicon nitride materials. For example, the side spacer 103A may include SiOCN, the bottom spacer 103B may include SiN to have etch selectively against each other.

Further, a thickness TH2 of the bottom spacer 103B may be greater than a thickness TH1 of the side spacer 103A to support a self-aligned etching process to form the backside gate contact structures BG1 and BG2, as will be described later.

As the contact spacer 103 may prevent metal diffusion from the backside source/drain contact structures BC1-BC3, the contact spacer 103 may function as an additional or back-up isolation structure between the $1^{st}$ backside source/drain contact structure BC1 and the adjacent backside gate contact structure BG1, and between the $3^{rd}$ backside source/drain contact structure BC3 and the adjacent $2^{nd}$ backside gate contact structure BG2 in the backside isolation structure 106 which is formed earlier than the contact spacer 103.

Further, the contact spacer 103 may enable the backside gate contact structures BG1 and BG2 to be formed in a self-aligned manner to contact the bottom surfaces of the $2^{nd}$ and $5^{th}$ gate structures G2 and G5, respectively, during the backside process for the semiconductor device 20. For example, due to etch selectivity of the backside isolation structure 106 against the contact spacer 103, the contact spacer 103 may have served the backside process for the semiconductor device 20 by compensating for a possible masking/etching/deposition misalignment between the $1^{st}$ backside gate contact structure BG1 and the bottom surface of the $2^{nd}$ gate structure G2, and between the $2^{nd}$ backside gate contact structure BG2 and the bottom surface of the $5^{th}$ gate structure G5, as described below in reference to FIG. 3.

Figure 3:
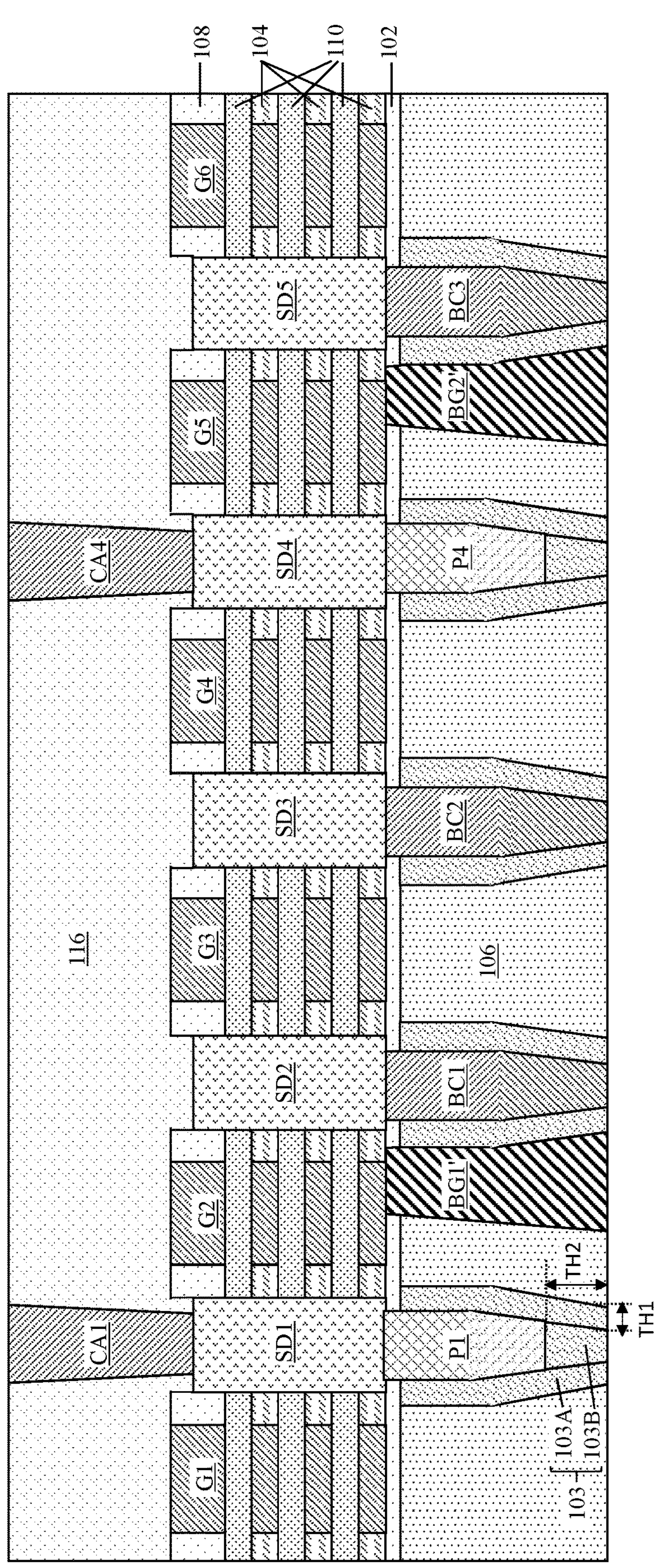
FIG. 3 illustrates a semiconductor device including a backside source/drain contact structure and a backside gate contact structure, according to another embodiment.

FIG. 3 illustrates a semiconductor device including a backside source/drain contact structure and a backside gate contact structure, according to another embodiment.

Referring to FIG. 3, a semiconductor device 30 includes the same structural elements of the semiconductor device 20 including the backside source/drain contact structures BC1-BC3 with the contact spacer 103 thereon. Thus, duplicate descriptions may be omitted herebelow.

However, the semiconductor device 30 may differ from the semiconductor device 20 in that $1^{st}$ and $2^{nd}$ backside gate contact structures BG1' and BG2 are not precisely aligned with the bottom surfaces of the $2^{nd}$ and $5^{th}$ gate structures G2 and G5, respectively. However, without regard to this misalignment, the backside gate contact structures BG1' and BG2' may be self-aligned with the bottom surfaces of the gate structures G2 and G5, respectively, along side surfaces of the contact spacers 103 formed on the backside source/drain contact structures BC1 and BC3, respectively.

For example, a side surface of the $1^{st}$ backside gate contact structure BG1' facing the $1^{st}$ backside source/drain contact structure BC1 may be in contact with the contact spacer 103 (103A) formed on the $1^{st}$ backside source/drain contact structure BC1. Similarly, a side surface of the $2^{nd}$ backside gate contact structure BG2' facing the $3^{rd}$ backside source/drain contact structure BC3 may be in contact with the contact spacer 103 (103A) formed on the $3^{rd}$ backside source/drain contact structure BC3. Thus, the side surfaces of the backside gate contact structures BG1' and BG2' contacting the contact spacers 103 may have different profiles from opposite side surfaces thereof shown in FIG. 3.

Because of the above-described self-alignment, the backside gate contact structures BG1' and BG2' may not wholly contact the bottom surfaces of the gate structures G2 and G5, and instead, portions of these backside gate contact structures may contact bottom surfaces of the lowermost inner spacers 104, respectively. For example, only a portion of a top surface of the $1^{st}$ backside gate contact structure BG1' may contact the bottom surface of the $2^{nd}$ gate structure, and another portion of the top surface of the $1^{st}$ backside gate contact structure BG1' may contact the bottom surface of the lowermost inner spacer 104.

Further, there may be no backside isolation structure 106 between the contact spacer 103 and each of the backside gate contact structures BG1' and BG2'. Accordingly, the $1^{st}$ backside gate contact structure BG1' may be disposed closer to the $2^{nd}$ source/drain region SD2 than the $1^{st}$ source/drain region SD1, and the $2^{nd}$ backside gate contact structure BG2' may be disposed closer to the $5^{th}$ source/drain regions SD5 than the $4^{th}$ source/drain region SD4. However, similar to the semiconductor device 20, the $1^{st}$ backside gate contact structure BG1' may be separated from the contact spacer 103 on the $1^{st}$ placeholder structure P1 by the backside isolation structure 106. Similarly, the $2^{nd}$ backside gate contact structure BG2' may be separated from the contact spacer 103 on the $4^{th}$ placeholder structure P4.

As will be described later in reference to FIGS. 4A-4O, the above-described imprecise alignment or misalignment of the backside gate contact structures BG1' and BG2' with the $2^{nd}$ and $5^{th}$ gate structures G2 and G5 may have been caused by one or more errors in a masking/etching/deposition operation in the backside process for the semiconductor device 30. However, the contact spacer 103 that has enabled the self-aligned formation of the backside gate contact structures BG1' and BG2' may sufficiently isolate these backside gate contact structures from the backside source/drain contact structures BC1 and BC3, respectively.

Herebelow, a method of manufacturing a semiconductor device corresponding to the semiconductor device 20 shown in FIG. 2 and the semiconductor device 30 shown in FIG. 3 is described.

Figure 4A:
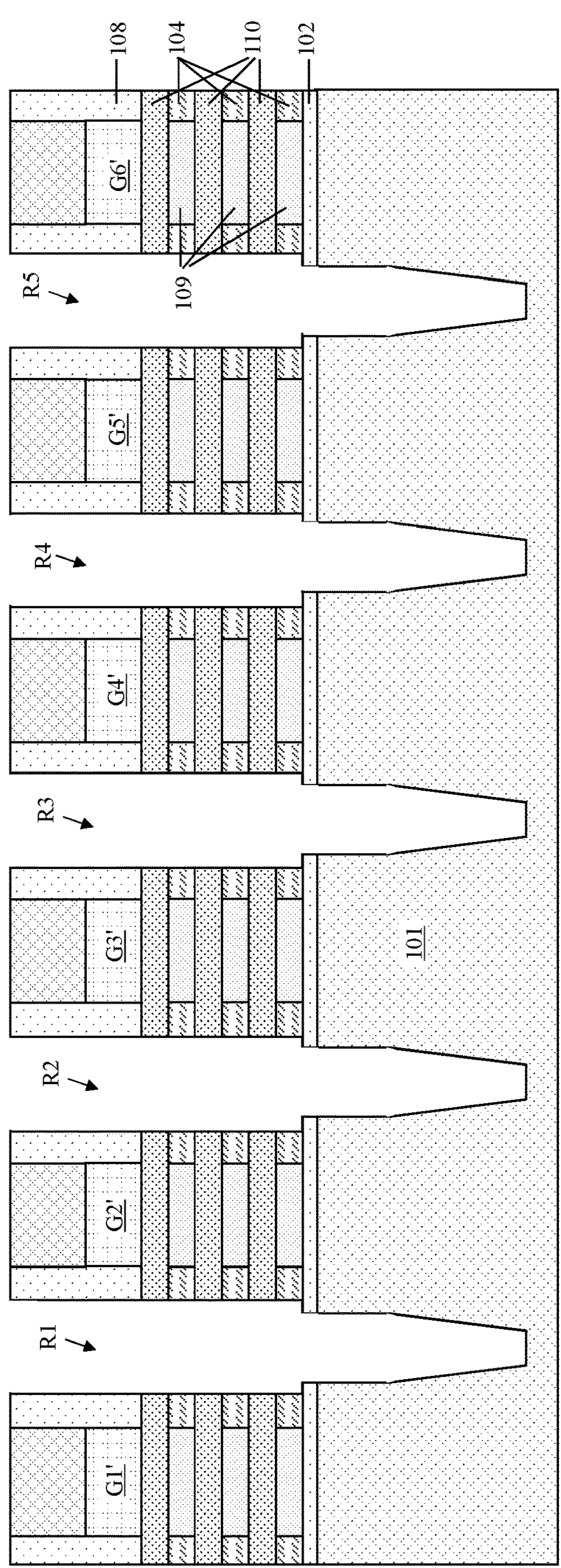
FIGS. 4A-4O illustrate intermediate semiconductor devices obtained after respective steps of manufacturing a semiconductor device including a backside source/drain contact structure and a backside gate contact structure, according to embodiments.
Figure 4B:
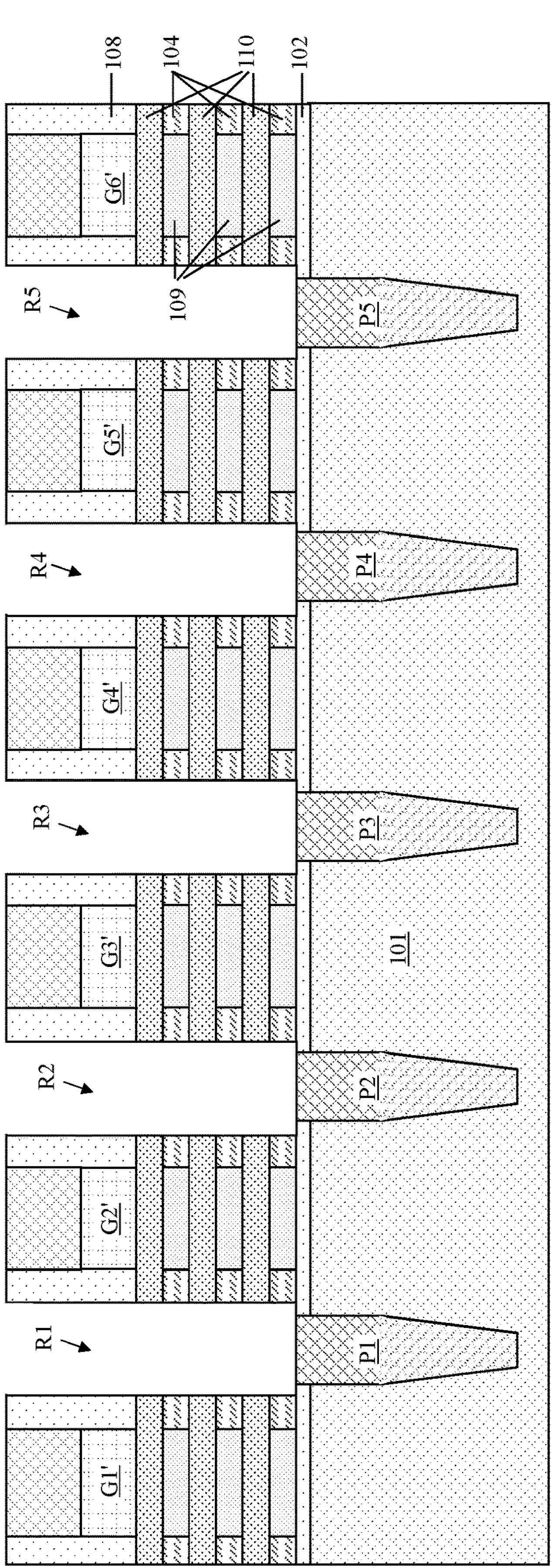
Figure 4C:
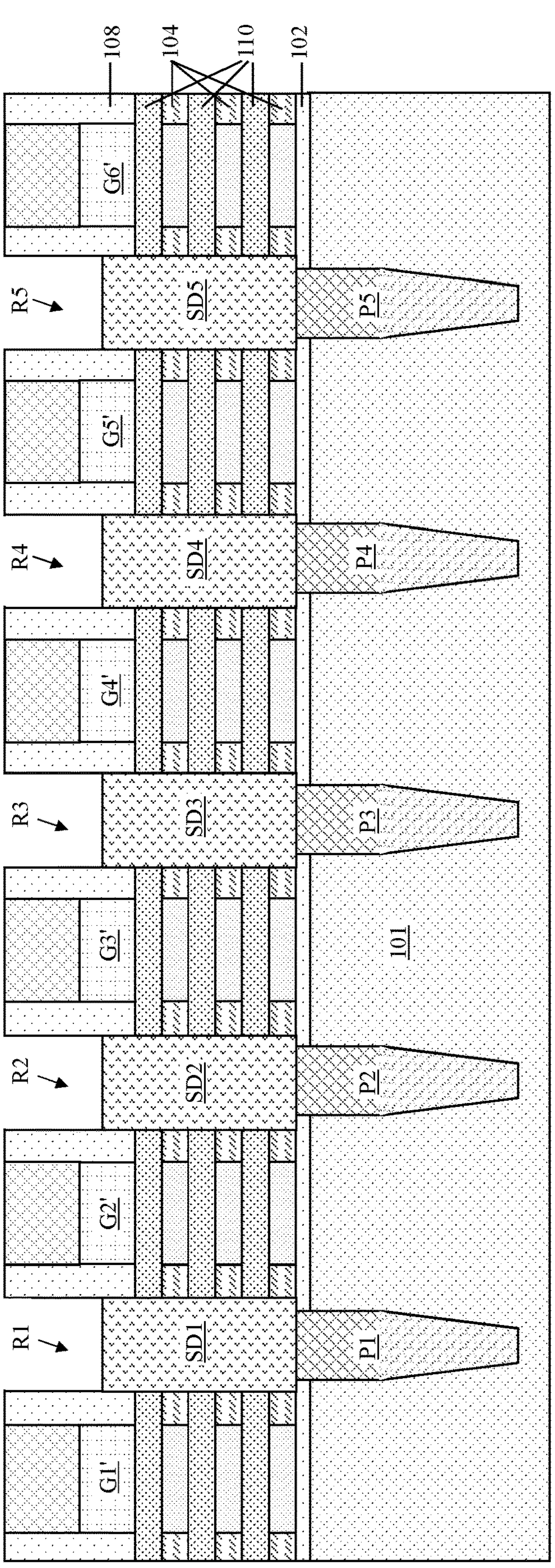
Figure 4D:
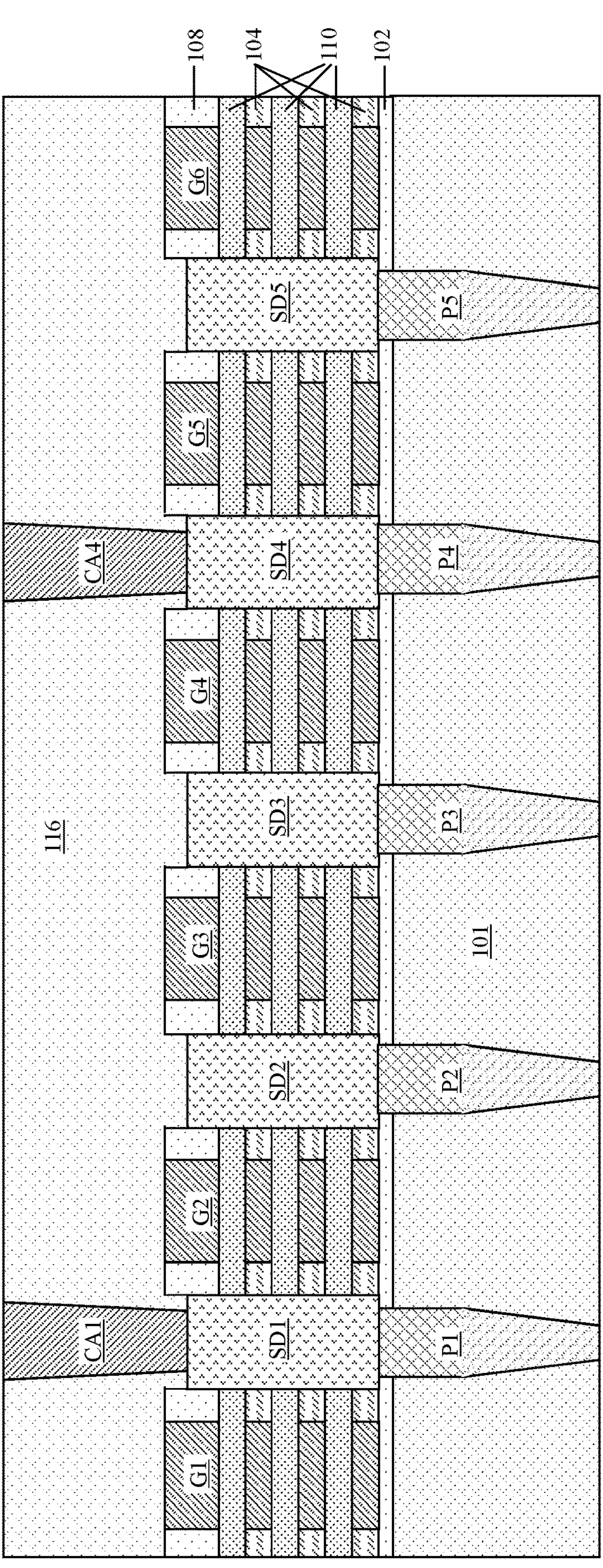
Figure 4E:
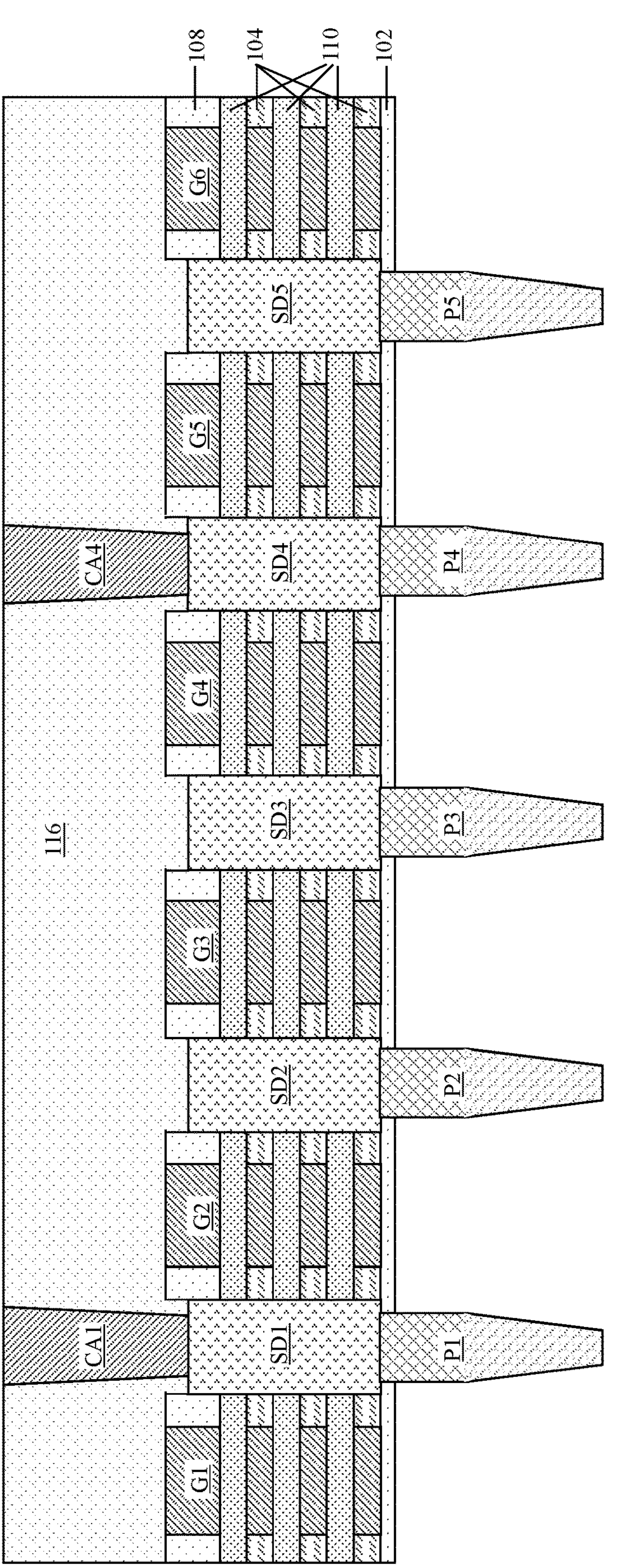
Figure 4F:
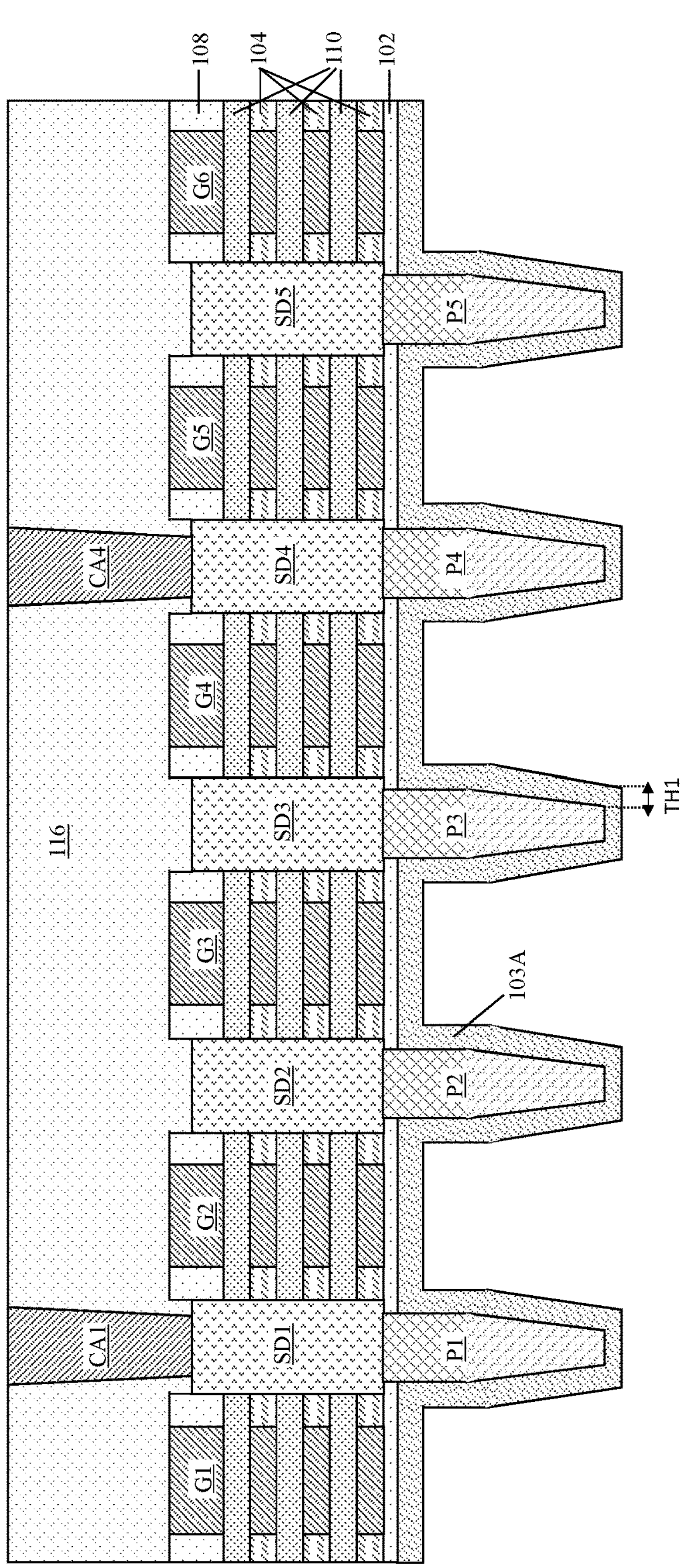
Figure 4G:
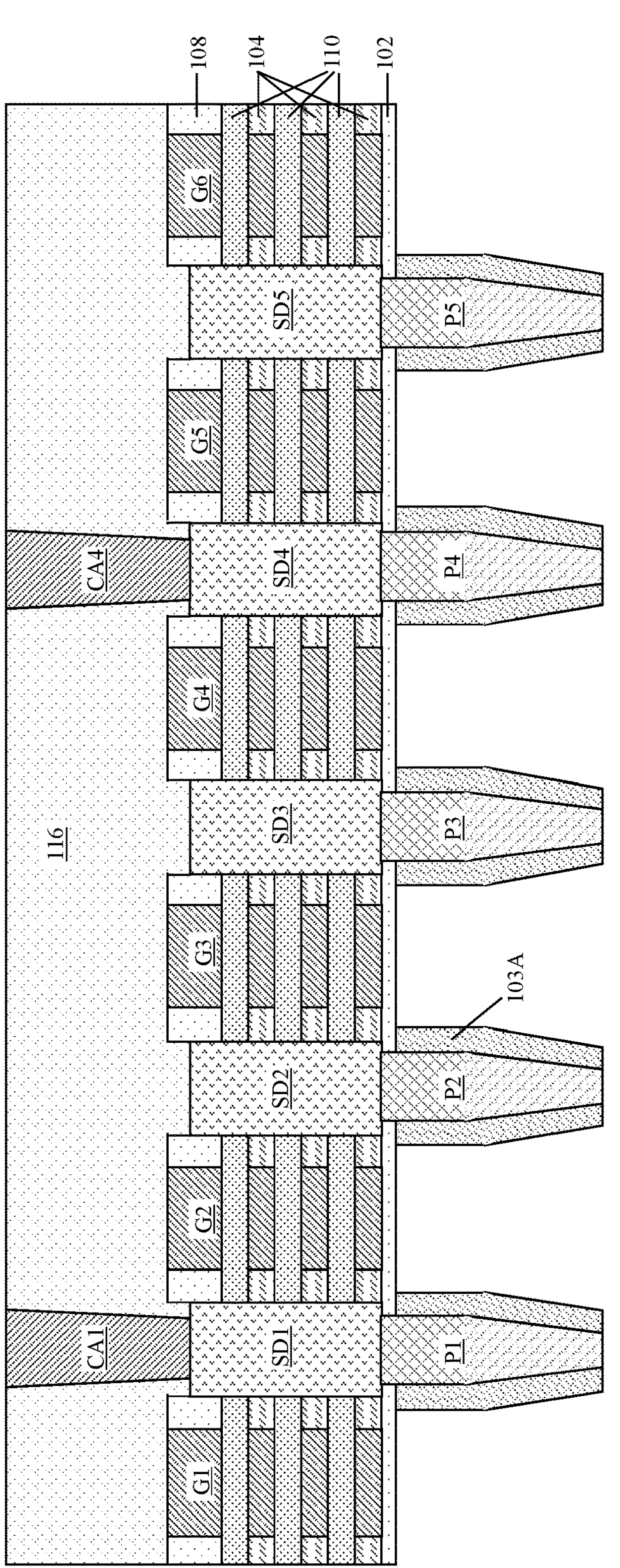
Figure 4H:
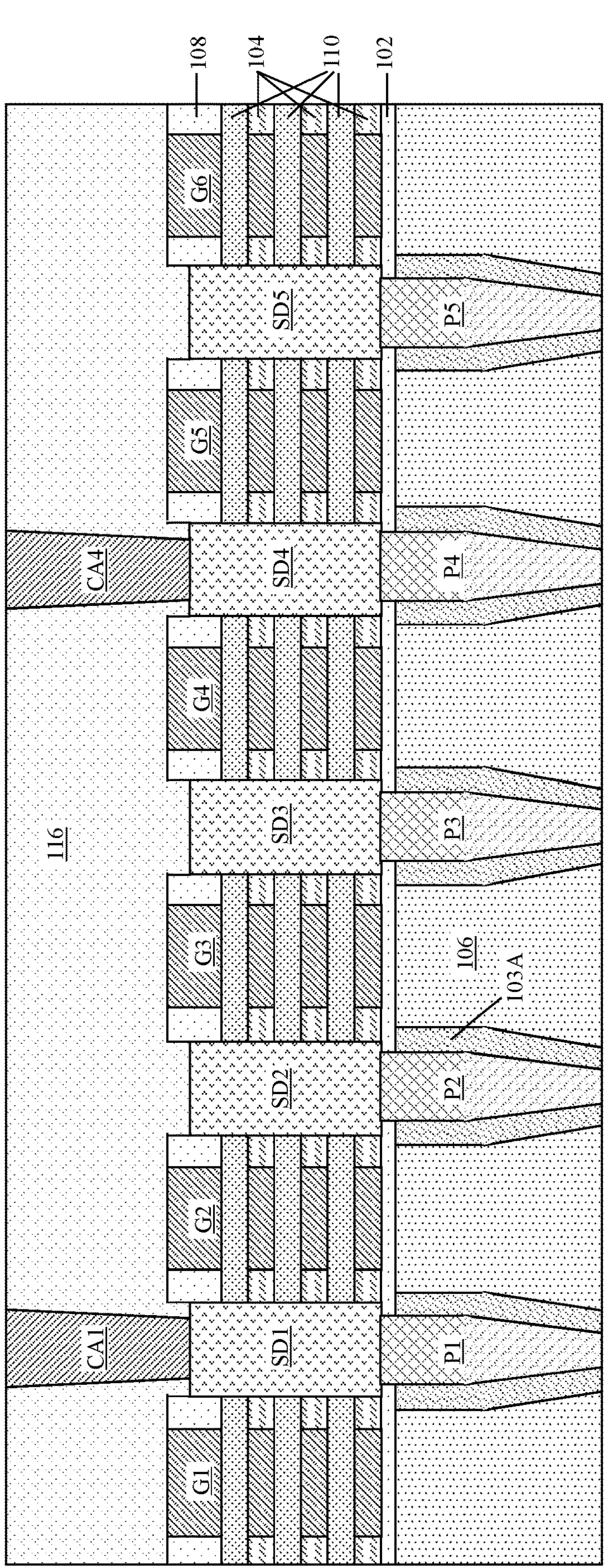
Figure 4I:
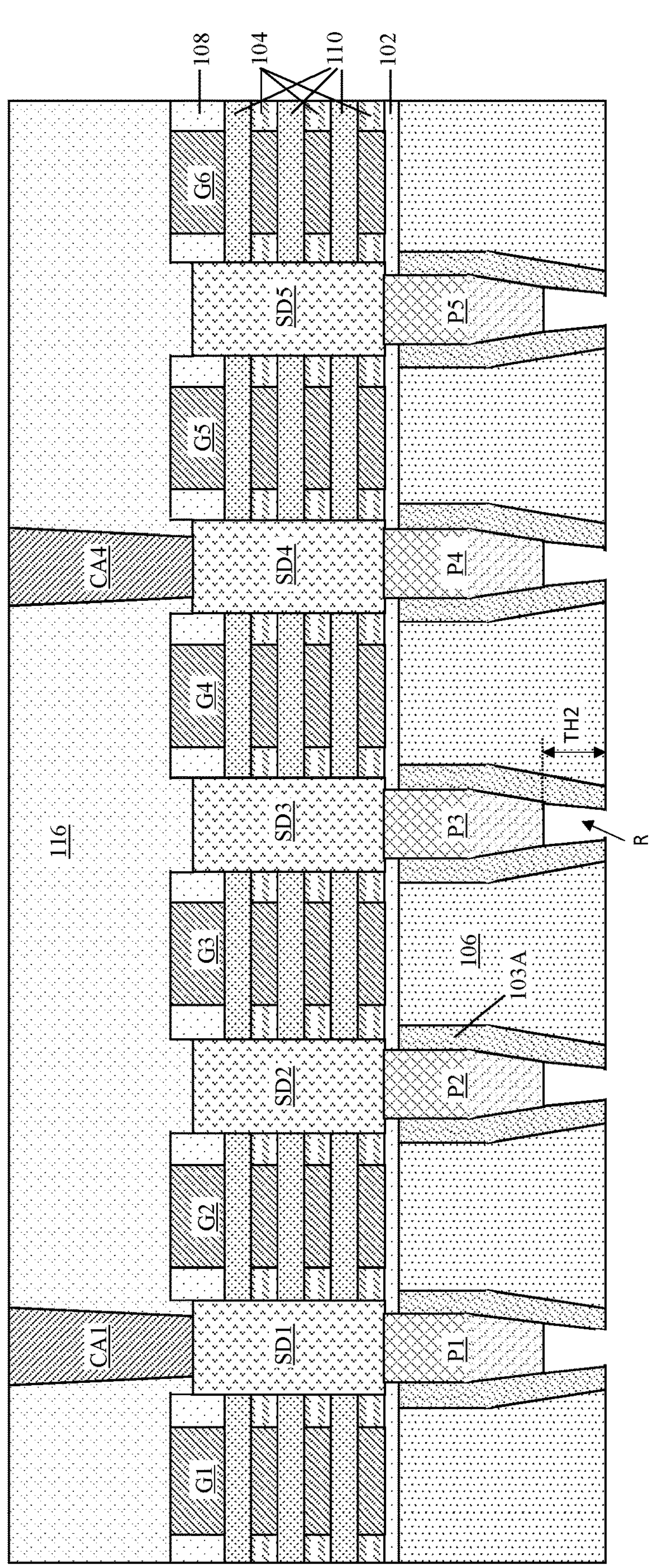
Figure 4J:
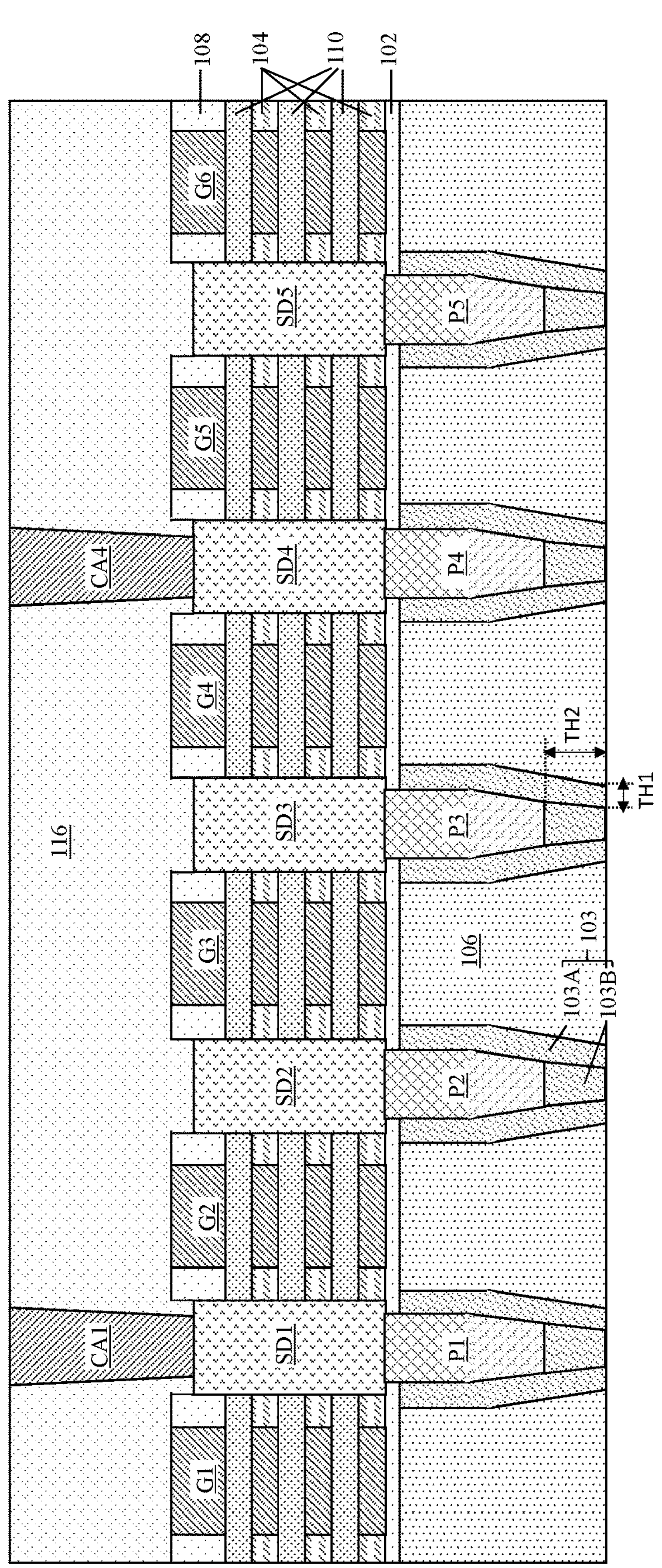
Figure 4K:
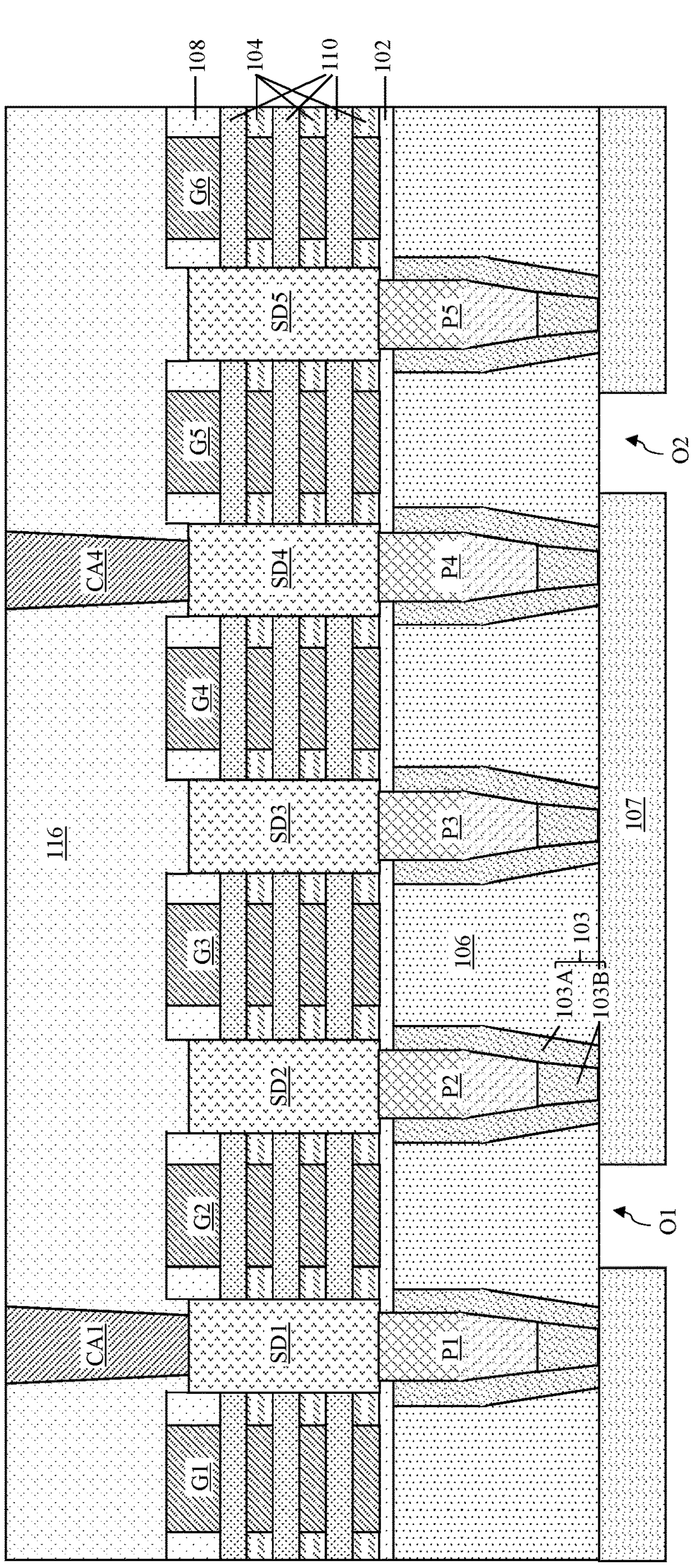
Figure 4L:
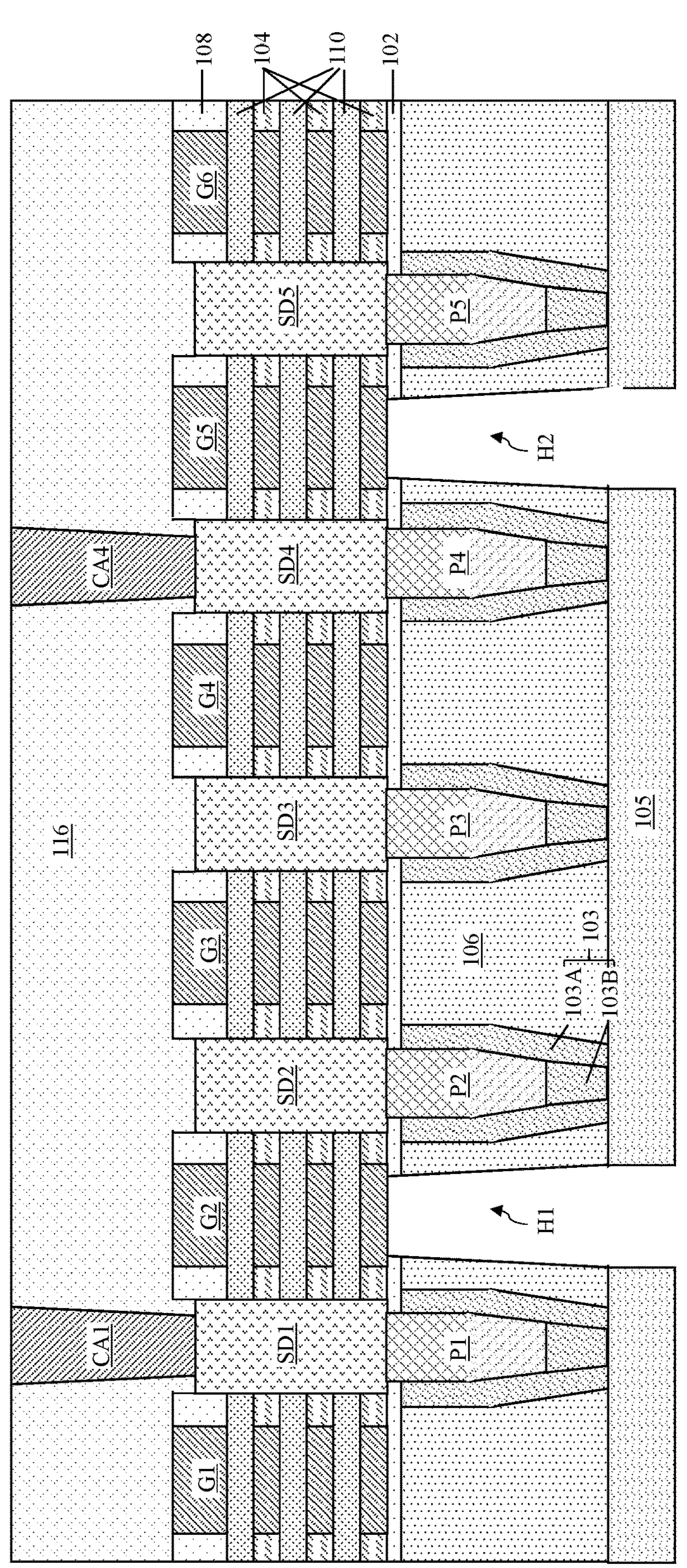
Figure 4M:
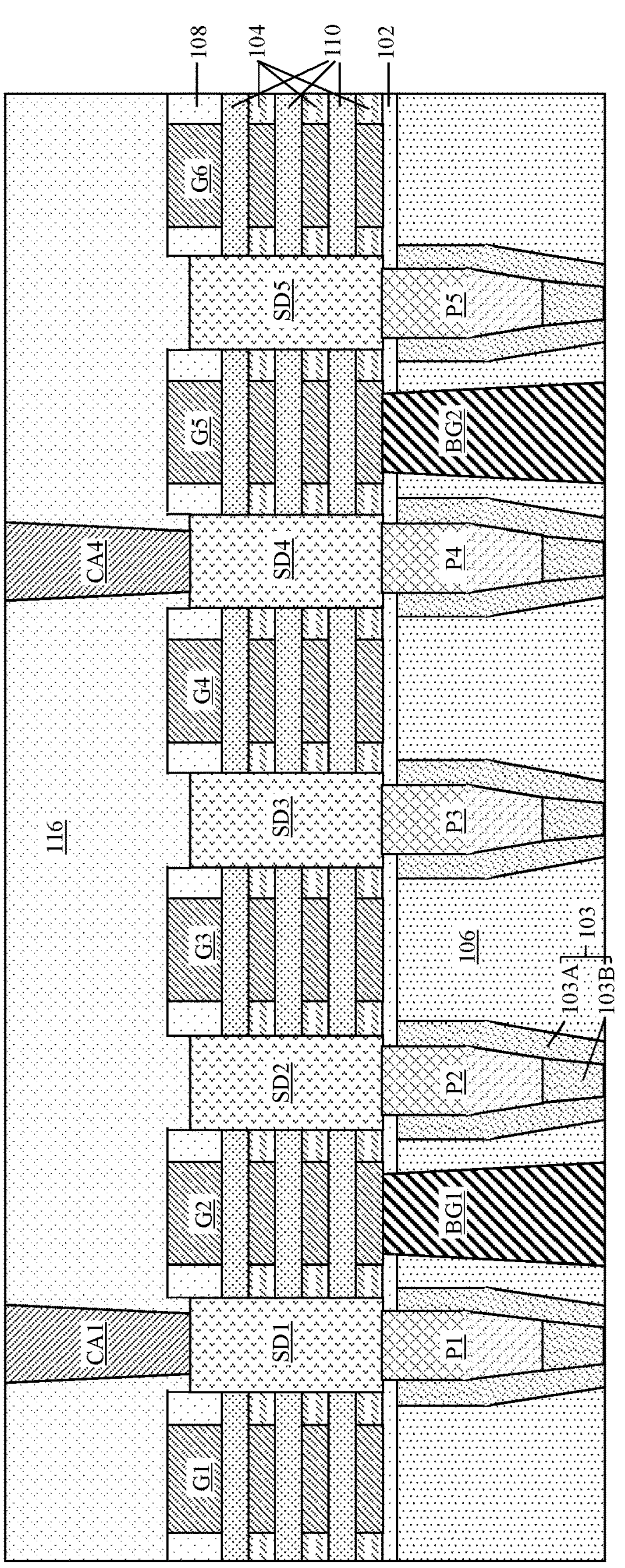
Figure 4N:
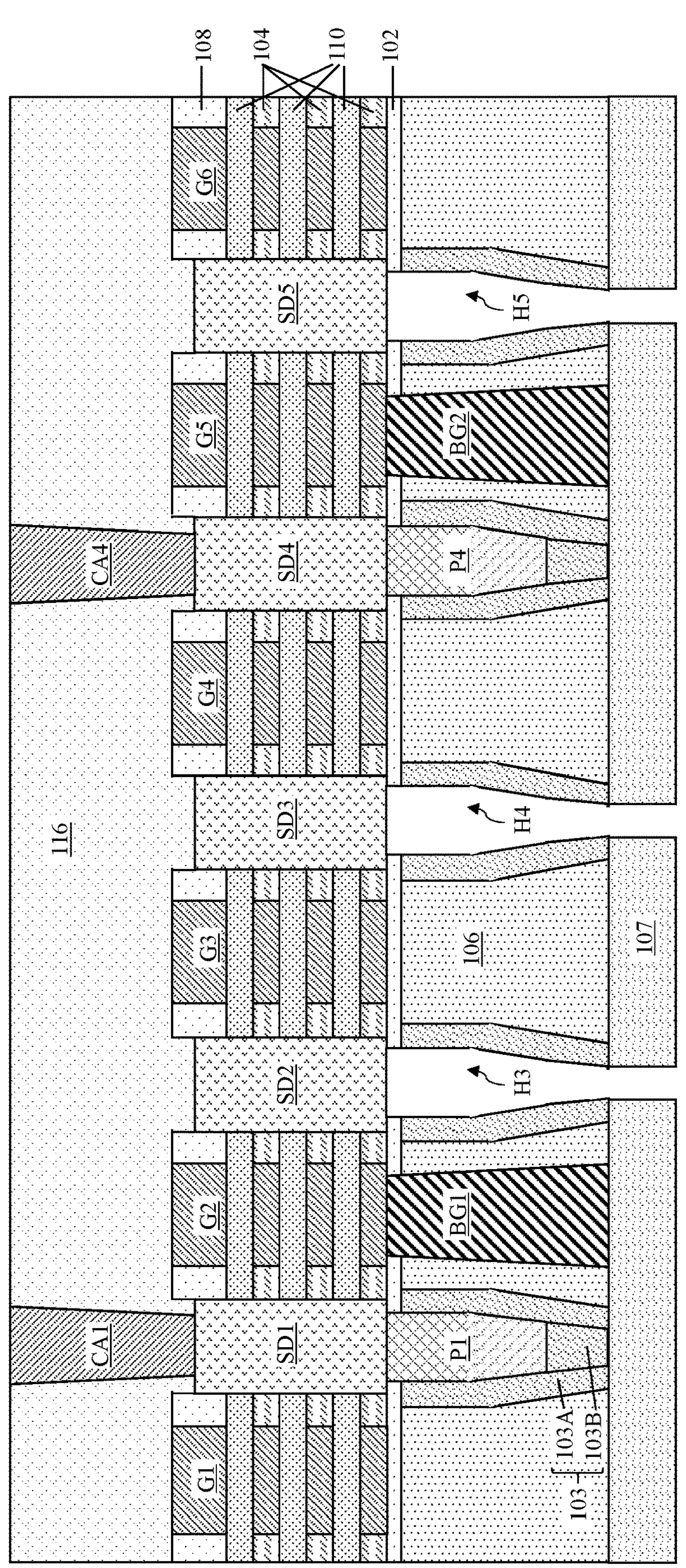
Figure 4O:
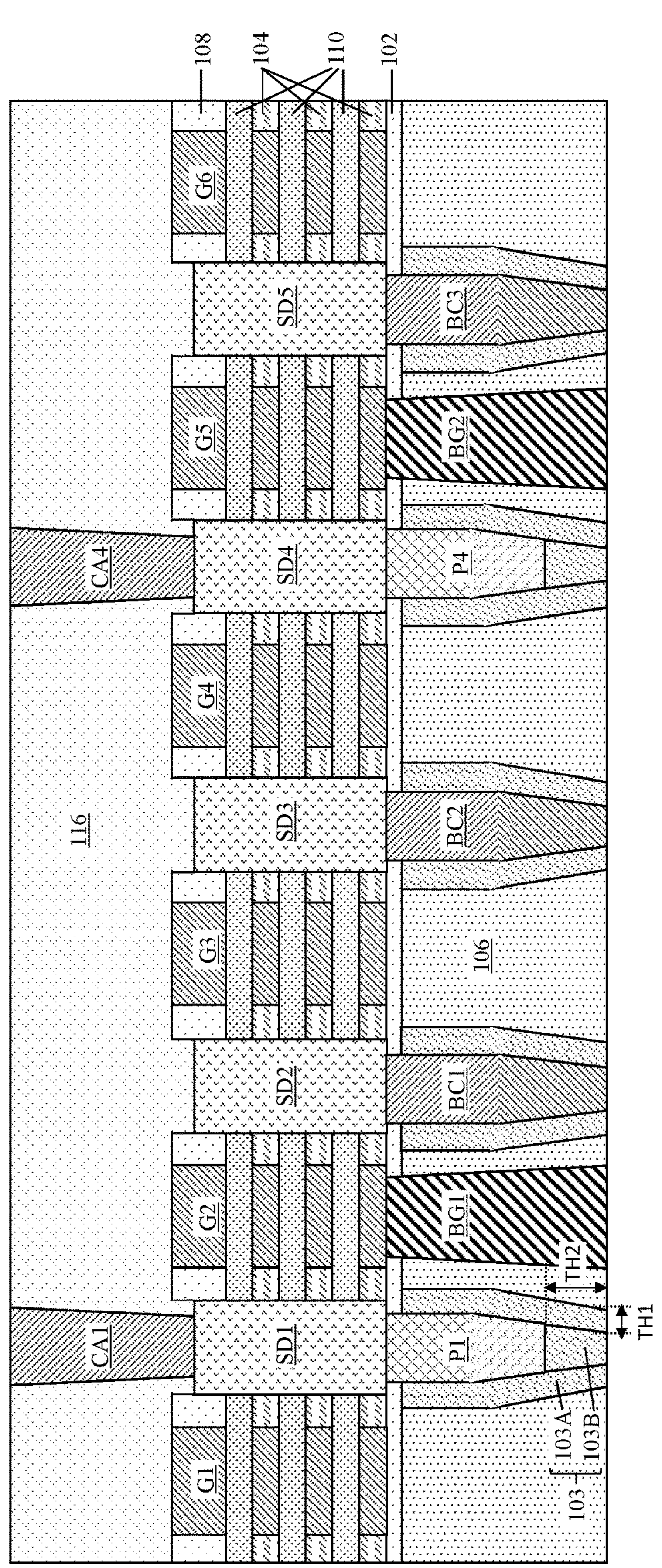

FIGS. 4A-4O illustrate intermediate semiconductor devices obtained after respective steps of manufacturing a semiconductor device including a backside source/drain contact structure and a backside gate contact structure, according to embodiments.

As the semiconductor device manufactured through the respective steps as shown in FIGS. 4A-4O may be the same as or may correspond to the semiconductor device 20 shown in FIG. 2, duplicate descriptions thereof may be omitted and the same reference numbers may be used in the descriptions herebelow.

Referring to FIG. 4A, an intermediate semiconductor device 20' including a plurality of semiconductor stacks on the substrate 101 may be provided. These semiconductor stacks may include $1^{st}$ to $6^{th}$ dummy gate structures G1'-G6' with respective hard mask patterns HM1-HM6 thereon. The gate spacer 108 may be formed on side surfaces of the each of the dummy gate structures G1'-G6' and each of the hard mask patterns HM1-HM6. Further, each of the semiconductor stacks may include a plurality of sacrificial layers 109 and the channel layers 110 alternatingly stacked on the substrate 101 with the bottom isolation layer 102 therebetween. The sacrificial layers 109 and each of the dummy gate structures G1'-G6' in each of the semiconductor stacks will be replaced by each of the gate structures G1-G6 in a later step. At side surfaces of the sacrificial layers 109 may be formed the inner spacers 104. The dummy gate structures G1'-G6' may each be formed of amorphous silicon or poly-silicon.

The semiconductor stacks may be obtained by dividing a single initial semiconductor stack formed on the substrate 101 through, for example, operations of lithography, masking and top-down etching based on the hard mask patterns HM1-HM6, to form five recesses R1-R5 between the semiconductor stacks. These recesses R1-R5 may reach from a front side of the intermediate semiconductor device 20' to an inside of the substrate 101 below a level of a top surface of the substrate 101. In the recesses R1-R5 will be formed placeholder structures and source/drain regions respectively thereabove in subsequent steps.

Each of the sacrificial layers 109 may include silicon-germanium (SiGe) while each of the channel layers 110 may include silicon (Si). The hard mask patterns HM1-HM6 may include a silicon nitride or titanium nitride (e.g., SiN, $Si_3N_4$ or TiN).

Referring to FIG. 4B, lower portions of the recesses R1-R5 may be filled in with the placeholder structure P1-P5, respectively. These placeholder structures may be reserved to provide spaces where backside source/drain contact structures are to be formed in a later step.

The placeholder structures P1-P5 may be formed by filling a material such as SiGe in the lower potions of the recesses R1-R5 in the substrate 101 such that a top surface of each of the placeholder structures P1-P5 is at the same level as a bottom surface of each of the inner spacers 104, for example. The formation of the placeholder structures P1-P5 may be performed through, for example, chemical vapor deposition (CVD), plasma enhanced CVD (PECVD), physical vapor deposition (PVD), atomic layer deposition (ALD), or a combination thereof, and planarized by, for example, chemical mechanical polishing (CMP), nblt.

Referring to FIG. 4C, the source/drain regions SD1-SD5 may be formed on the placeholder structures P1-P5, respectively, by epitaxially growing silicon included in the channel layers 110 exposed through the recesses R1-R5. The source/ drain regions SD1-SD5 may be formed such that bottom surfaces thereof contact the 1st to 5th source/drain regions SD1-SD5, respectively.

Referring to FIG. 4D, The hard mask patterns HM1-HM6 may be removed, and the frontside isolation structure 116 may be formed on the semiconductor stacks of the intermediate semiconductor device 20' obtained in the previous step. Further, the dummy gate structures G1'-G6' along with the sacrificial layers 109 may be replaced by the gate structures G1-G6, respectively. Thus, the semiconductor stacks of the intermediate semiconductor device 20' may form respective nanosheet transistor structures formed on the substrate 101.

The hard mask patterns HM1-HM6 may be removed through, for example, ashing, stripping and/or etching operations, and the formation of the frontside isolation structure 116 may be performed through, for example, PVD, CVD, PECVD, or a combination thereof, followed by CMP. The removal of the dummy gate structures G1'-G6' and the sacrificial layers 109 may be performed through, for example, dry etching, wet etching, reactive ion etching (RIE) and/or a chemical oxide removal (COR) process. The formation of the gate structures G1-G6 may be performed through, for example, at least one of ALD, CVD, PVD, PECVD, etc.

Although a backside process has been performed on the intermediate semiconductor device 20' to form the placeholder structures P1-P5 to reserve spaces for the formation of respective backside contact structures, a circuit design may have directed the 1st and 4th frontside source/drain contact structures CA1 and CA4 to be formed on the top surfaces of the 1st and 4th source/drain regions SD1 and SD4, respectively.

Referring to FIG. 4E, the backside process for the intermediate semiconductor device 20' may continue with removal of the substrate 101.

The substrate 101 may be removed through, for example, dry etching, wet etching, ashing and/or stripping, not being limited thereto, after turning upside down the intermediate semiconductor device 20' obtained in the previous step to facilitate the backside process.

As the substrate 101 is removed, a bottom surface of the bottom isolation layer 102 and a bottom surface and a side surface of each of the placeholder structures P1-P5 may be exposed.

Referring to FIG. 4F, the side spacer 103A may be conformally formed on the bottom surface of the bottom isolation layer 102 and the bottom surface and the side surface of each of the placeholder structures P1-P5 exposed by the removal of the substrate 101 in the previous step.

The formation of the side spacer 103A may be performed through, for example, atomic layer deposition (ALD), not being limited thereto, such that the side spacer 103A may have the thickness TH1 as shown in FIG. 2.

Referring to FIG. 4G, the side spacer 103A may be partially patterned such that the side spacer 103A remains only on the side surfaces of the placeholder structures P1-P5.

This partial patterning of the side spacer 103A may be performed through, for example, an anisotropic dry etching such as reactive ion etching (RIE), not being limited thereto.

Referring to FIG. 4H, the backside isolation structure 106 may be formed to isolate backside contact structures and backside metal lines to be formed in a later step.

The formation of the backside isolation structure 106 may be performed through, for example, PVD, CVD, PECVD, ALD, or a combination thereof, and planarized by, for example, CMP, not being limited thereto, so that the bottom surfaces of the backside isolation structure 106, the side spacer 103A and the placeholder structures P1-P5 may be coplanar with each other.

Referring to FIG. 4I, the placeholder structures PL1-PL5 may be partially recessed against the side spacer 103A.

The partial recess of the placeholder structure PL1-PL5 may be performed through, for example, dry etching and/or wet etching based on an etchant such as hydrofluoric acid (HF), nitric acid (HNO3) or a mixture thereof to selectively etch silicon germanium (SiGe) or silicon oxide (e.g., SiO or $SiO_2$) forming the placeholder structures against silicon nitride (e.g., SiN, SiBCN, SiOCN, SiOC, etc.) forming the side spacer 103A.

In this step, each of the placeholder structures PL1-PL5 may be recessed from the bottom surface thereof to form a recess R surrounded by a lower portion of the side spacer 103A. The recess R may have a depth, which is the same as the thickness TH2 of the bottom spacer 103B to be formed therein in a next step.

Referring to FIG. 4J, the recess R formed below each of the placeholder structures PL1-PL5 in the previous step may be filled in with the bottom spacer 103B to finalize the contact spacer 103 along with the earlier-formed side spacer 103A.

A material such as silicon nitride (e.g., SiN, SiBCN, SiOCN, SiOC, etc.) may be filled in the recess R to form the bottom spacer 103B through, for example, PVD, CVD, PECVD, etc., and planarized by, for example, CMP, not being limited thereto. Thus, the bottom spacer 103B may have the thickness TH2 which is the same as the depth of the recess R.

As the bottom spacer 103B is formed in the recess R and planarized, the bottom spacer 103B along with the side spacer 103A may form the contact spacer 103 enveloping the side surface and the bottom surface of each of the placeholder structure PL1-PL5. Further, the bottom surfaces of the backside isolation structure 106 and the contact spacers 103 may become coplanar with each other again.

Referring to FIG. 4K, a photoresist layer or a hard mask structure may be formed on a bottom surface of the backside isolation structure 106, and patterned to form a 1st masking structure 107 with two openings O1 and O2 exposing the bottom surface of the backside isolation structure 106.

The openings O1 and O2 may be formed to be vertically aligned with or correspond to the bottoms surfaces of the 2nd and 5th gate structures G2 and G5 so that a subsequent etching operation through the openings O1 and O2 may expose the bottom surfaces of the 2nd and 5th gate structures G2 and G5 in a next step.

Referring to FIG. 4L, the backside isolation structure 106 and the bottom isolation layer 102 may be patterned based on the 1st masking structure 107 to form two holes H1 and H2 exposing the bottom surfaces of the 2nd and 5th gate structures G2 and G5, respectively. These two holes H1 and H2 will be filled in with the material forming the backside gate contact structures BG1 and BG2 in a next step.

The patterning of the backside isolation structure 106 and the bottom isolation layer 102 which may be formed of silicon oxide (e.g., SiO, $SiO_2$, etc.) may be performed through, for example, dry etching or wet etching using an etchant such as hydrofluoric acid (HF), not being limited thereto, having etch selectively against silicon nitride (e.g., SiN, SiBCN, SiOCN, etc.) that forms the contact spacer 103.

As the silicon nitride of the contact spacer 103 may be able to withstand this selective etching, a misaligned masking and etching operation on the backside isolation structure 106 may not compromise the adjacent contact spacer 103 and the placeholder structures P2 and P5 which are surrounded by the contact spacer 103 and which will be replaced by the backside source/drain contact structures BC2 and BC5, respectively. This possible misaligned masking and etching will be descried later in reference to FIGS. 5A-5C.

Referring to FIG. 4M, the holes H1 and H2 in the backside isolation structure 106 may be filled in with the material forming the 1st and 2nd backside gate contact structures BG1 and BG2, respectively, through, for example, PVD, CVD, PECVD, or a combination thereof, not being limited thereto, and the 1st masking structure 107 may be removed through, for example, ashing or stripping. Further, the bottom surface of the intermediate semiconductor device 20' including the backside gate contact structures BG1 and BG2 may be planarized through, for example, CMP.

Referring to FIG. 4N, a 2nd masking structure 107 may be formed on the bottom surface of the intermediate semiconductor device 20' obtained in the previous step to be aligned with the 2nd, 3rd and 5th placeholder structures P2, P3 and P5, and, based on the 2nd masking structure 107, the bottom spacer 103B and the placeholder structures P2, P3 and P5 thereon may be removed, through, dry etching and/or wet etching, to form holes H3, H4 and H5 that expose the bottom surfaces of the 2nd, 3rd and 5th source/drain regions SD2, SD3 and SD5, respectively.

For example, the bottom spacer 103B may be removed through dry etching and/or wet etching based on the 2nd masking structure 107, and the placeholder structures P2 and P5 formed of silicon germanium (SiGe) may be removed through dry etching and/or wet etching based on the side spacer 103A using an etchant such as hydrofluoric acid (HF) or nitric acid ($HNO_3$), not being limited thereto, that may selectively etch silicon germanium (SiGe) or silicon oxide (e.g., SiO, $SiO_2$) forming the placeholder structures P2, P3 and P5 against silicon nitride (e.g., SiN, SiBCN, SiOCN, etc.) forming the side spacer 103A.

Thus, each of the holes H3, H4 and H5 formed by the selective etching operation may be surrounded by the contact spacer 103 (103A) to expose the bottom surface of each of the 2nd, 3rd and 5th source/drain regions SD2, SD3 and SD5, respectively.

Referring to FIG. 4O, the holes H3, H4 and H5 obtained in the previous step may be filled in with the material forming the 2nd, 3rd and 5th backside source/drain contact structures BC1, BC2 and BC3, respectively, through, for example, PVD, CVD, PECVD, or a combination thereof, not being limited thereto, and the 2nd masking structure 107 may be removed through, for example, ashing or stripping. Further, the bottom surface of the intermediate semiconductor device 20' including the backside source/drain contact structures BC1, BC2 and BC3 and the backside gate contact structures BG1 and BG2 may be planarized through, for example, CMP.

Subsequently, one or more backside metal lines may be connected to the backside gate contact structures BG1 and BG2 to deliver respective gate input signals or a common gate input signal to the gate structures G2 and G5 through the backside gate contact structures BG1 and BG2, respectively. Also, another one or more backside metal lines may be connected to the backside source/drain contact structures BC1-BC3 to connect the source/drain regions SD2, SD3 and SD5 to one or more voltage sources or other circuit elements though the backside source/drain contact structures BC1-BC3, respectively, thereby obtaining the semiconductor device 20 shown in FIG. 2.

In the meantime, referring back to FIG. 4H, the 1st masking structure may be patterned imprecisely, and thus, the openings O1 and O2 may be misaligned with the bottom surfaces of the gate structures G2 and G5, respectively, in the nanometer-scale device structure. Thus, subsequent etching and deposition operations in the backside process may also result in prohibited connections between backside contact structures to be formed in the backside isolation structure 106. However, the contact spacer 103 surrounding the placeholder structures P1-P5 may serve the backside process by compensating for such masking/etching/deposition misalignment as described below.

Figure 5A:
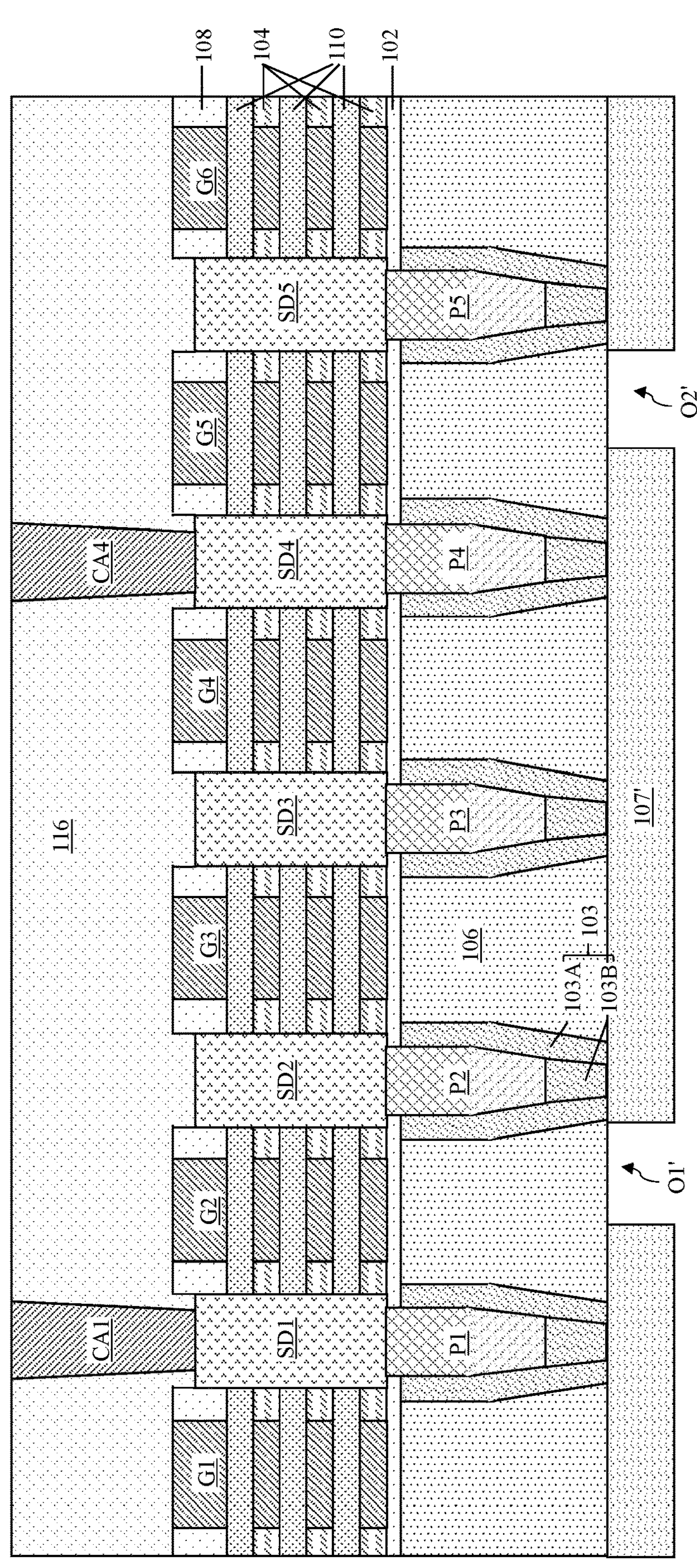
FIGS. 5A-5C illustrates intermediate semiconductor devices obtained after respective steps of manufacturing a semiconductor device including a backside source/drain contact structure and a backside gate contact structure, according to other embodiments.
Figure 5B:
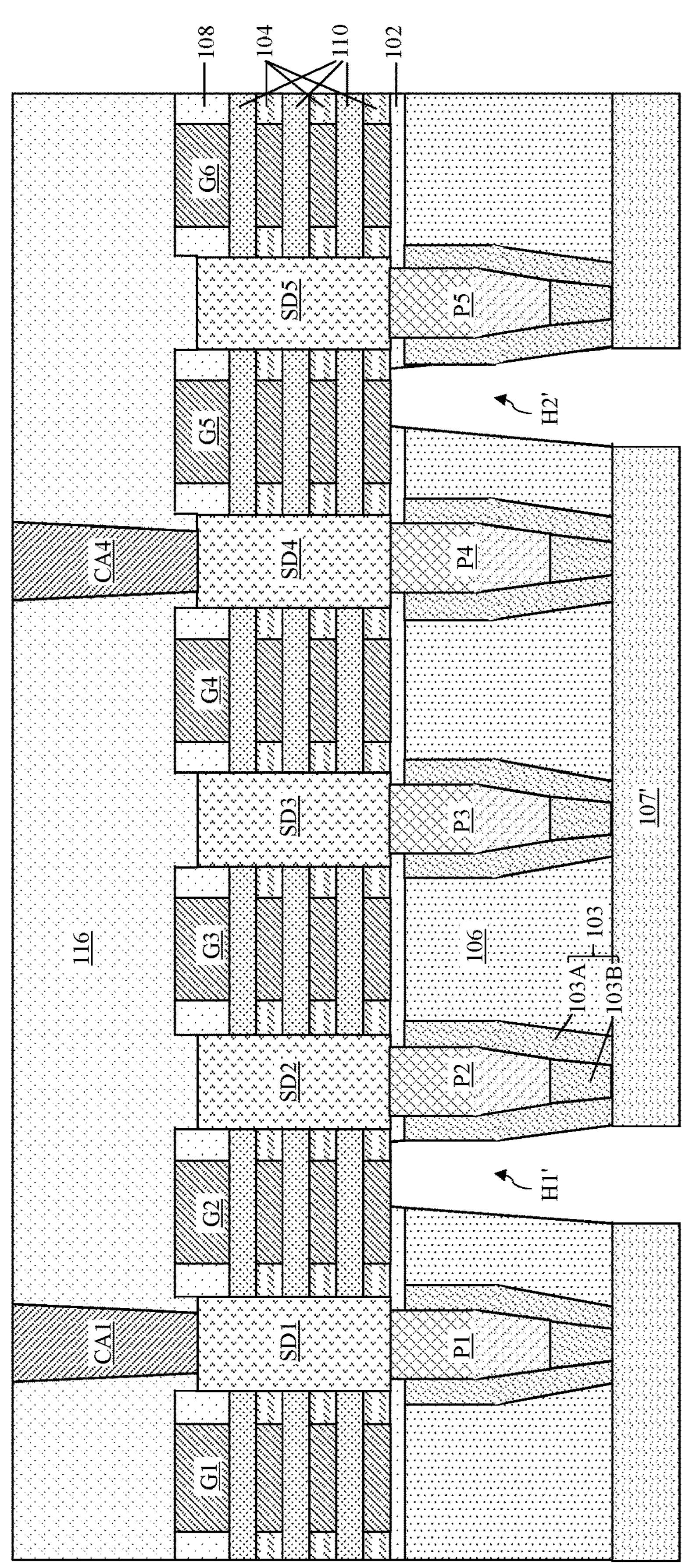
Figure 5C:
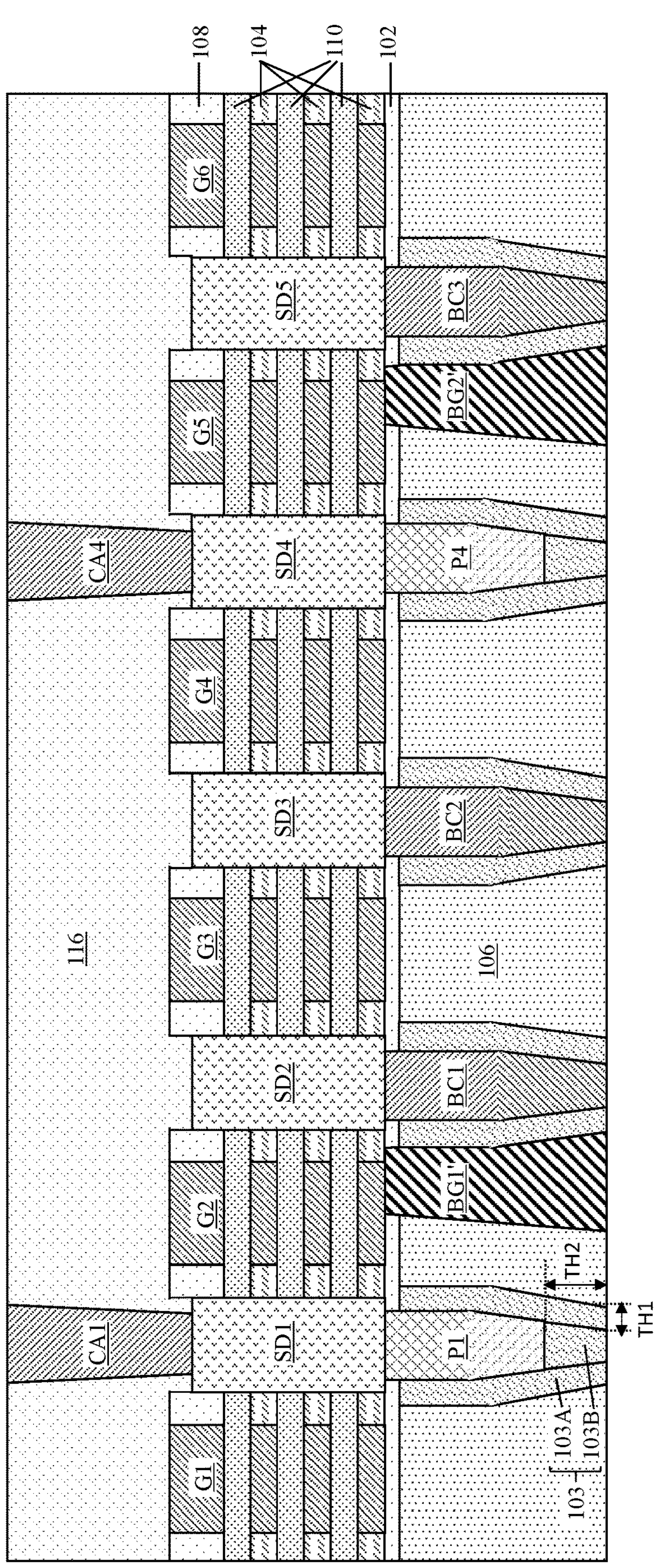

FIGS. 5A-5C illustrates intermediate semiconductor devices obtained after respective steps of manufacturing a semiconductor device including a backside source/drain contact structure and a backside gate contact structure, according to other embodiments.

Referring to FIG. 5A, an intermediate semiconductor device 30' may have the same structural elements of the intermediate semiconductor device 20' of FIG. 4I except that openings O1' and O2' of a masking structure 107' may be formed to be vertically misaligned or imprecisely aligned with the bottom surfaces of the gate structures G2 and G5, respectively.

Referring to FIG. 5B, because of the masking structure 107' with the misaligned openings O1' and O2', an etching operation performed on the backside isolation structure 106 based on the masking structure 107' may form respective holes H1' and H2' which may also be misaligned or imprecisely aligned with the bottom surfaces of gate structures G2 and G5, respectively. Thus, the contact spacer 103 may be exposed through the holes H1 and H2.

However, the contact spacer 103 formed of silicon nitride (e.g., SiN, SiBCN, SiOCN, etc.) may withstand the selective etching operation targeting the backside isolation structure 106 formed of silicon oxide (e.g., SiO, $SiO_2$, etc.) when the etchant such as hydrofluoric acid (HF) for dry etching and/or wet etching is applied to the contact spacer 103 during the formation of the holes H1' and H2'. Thus, the contact spacer 103 may prevent the etchant from reaching the backside source/drain contact structures BC1 and BC3, respectively, which may subsequently disrupt formation of the backside source/drain contact structures BC 1 and BC3 in a later step. Due to this selective etching operation, the holes H1' and H2' may be formed along a side surface of the contact spacer 103 to expose the bottom surfaces of the gate structure G2 and G5 and further the bottom surfaces of the lowermost inner spacers 104.

In the meantime, the openings O1' and O2' may be misaligned further with the bottom surfaces of the gate structures G2 and G5, respectively, such that at least portion of these openings may be aligned with the placeholder structures P2 and P5 to expose a bottom surface of the side spacer 103A and even a bottom surface of the bottom spacer 103B. However, even in this case, the selective etching may form self-aligned holes leading to the bottom surfaces of the gate structures G2 and G5 without compromising the placeholder structures P2 and P5 due to etch selectivity of the contact spacer 103 against the backside isolation structure 106. In this case, the bottom spacer 103B may be more or longer exposed to the etchant than the side spacer 103A. Thus, the bottom spacer 103B may be formed to have the thickness TH2 which is greater than the thickness TH1 of the side spacer 103A to better withstand the selective etching.

Referring to FIG. 5C, the backside gate contact structures BG1' and BG2' may be formed in the holes H1' and H2' in a self-aligned manner, respectively, through, for example, PVD, CVD, PECVD, or a combination thereof, not being limited thereto, and planarized. Further, the backside source/drain contact structures BC1-BC3 may be formed in the same process as described in reference to FIGS. 4N and 4O to obtain the semiconductor device 30 shown in FIG. 3.

Figure 6:
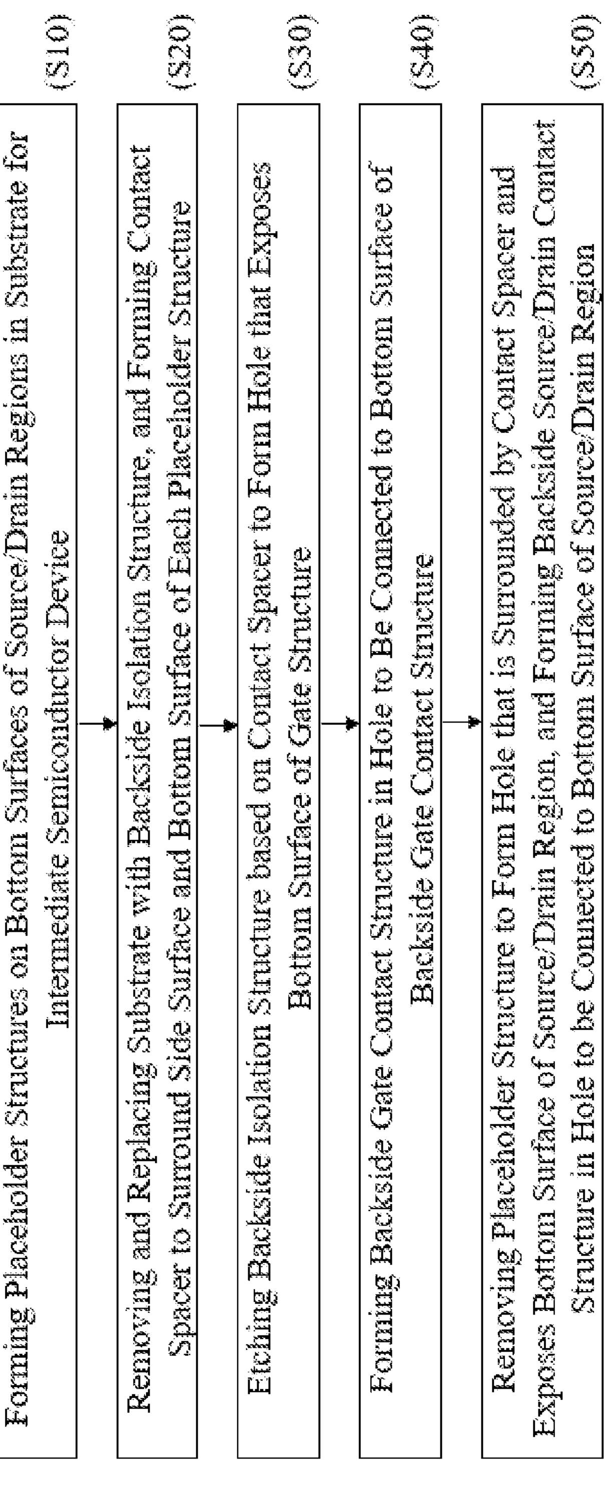
FIG. 6 illustrates a flowchart describing a method of manufacturing a semiconductor device including a backside source/drain contact structure and a backside gate contact structure in reference to FIGS. 4A-4O, according to embodiments.

FIG. 6 illustrates a flowchart describing a method of manufacturing a semiconductor device including a backside source/drain contact structure and a backside gate contact structure in reference to FIGS. 4A-4O, according to embodiments.

In step S10, a plurality of placeholder structures may be formed on bottom surfaces of a plurality of source/drain regions in a substrate for an intermediate semiconductor device. See FIGS. 4A-4D.

The placeholder structures may be formed in the substrate to reserve spaces where respective backside source/drain contact structures are to be formed. The placeholder structure may be formed of a material such as silicon germanium (SiGe) or silicon oxide (e.g., SiO, $SiO_2$, etc.).

In step S20, the substrate is removed and replaced by a backside isolation structure, and a contact spacer may be formed to surround a side surface and a bottom surface of each of the placeholder structures. See FIGS. 4E-4J A backside process begins with the removal of the substrate and forming the backside isolation structure in a place from which the substrate is removed. To perform the backside process, the intermediate semiconductor device may be flipped upside down to direct a bottom surface of the backside source/drain contact structure in an upward direction.

The contact spacer may be formed on side surfaces and bottom surfaces of the placeholder structures to protect the placeholder structures in a subsequent etching operation performed on the backside isolation structure. When a semiconductor device is completed, the contact spacer may also an additional or back-up isolation profile to the semiconductor device. The contact spacer may be formed of one or more materials including silicon nitride (e.g., SiN, SiBCN, SiOCN, etc.).

In step S30, the backside isolation structure may be etched based on the contact spacer to form a hole that exposes a bottom surface of at least one gate structure. See FIGS. 4K and 4L.

For this step, a masking structure such as photoresist patterns or hard mask patterns with at least one opening vertically aligned with at least one gate structure may be formed on a bottom surface of the backside isolation structure, and the backside isolation structure may be etched based on the masking structure to form the hole exposing a bottom surface of the gate structure.

At this time, even when the opening is formed to be not correctly aligned with the bottom surface of the gate structure, and the hole is formed to expose the contact spacer. However, due etch selectivity between the backside isolation structure and the contact spacer, the hole may be formed in a self-aligned manner along the contact spacer to expose the bottom surface of the gate structure.

In step S40, a backside gate contact structure may be formed in the hole to be connected to the bottom surface of the backside gate contact structure. See FIG. 4M.

As the backside gate contact structure may be formed based on the contact spacer, the backside gate contact structure may be sufficiently isolated from the placeholder structures.

In step S50, at least one placeholder structure may be removed to form a hole that is surrounded by the contact spacer and exposes a bottom surface of at least one source/drain region, and a backside source/drain contact structure may be formed in the hole to be connected to the bottom surface of the source/drain region. See FIGS. 4N and 4O.

When the placeholder structure is removed, the contact spacer surrounding the placeholder structure may remain, and thus, the backside source/drain contact structure may be formed inside the contact spacer such that the backside source/drain contact structure is sufficiently isolated from the backside isolation structure and/or the backside gate contact structure.

The above embodiments have been described for manufacturing a semiconductor device including a plurality of nanosheet field-effect nanosheet transistors. However, the disclosure may not be limited thereto but may also apply to a semiconductor device including different types of field-effect transistor such as a FinFET. Further, the above embodiments may apply to a three-dimensional stacked field-effect transistor device (3D-stacked FET device) which is formed of a lower-stack field-effect transistor and an upper-stack field-effect transistor. For example, at least one selected backside gate contact structure and/or at least one selected backside source/drain contact structure may be formed for circuit elements of the lower-stack field-effect transistor, while at least one selected frontside gate structure and/or at least one selected frontside source/drain contact structure are formed for circuit elements of the upper-stack field-effect transistor.

Figure 7:
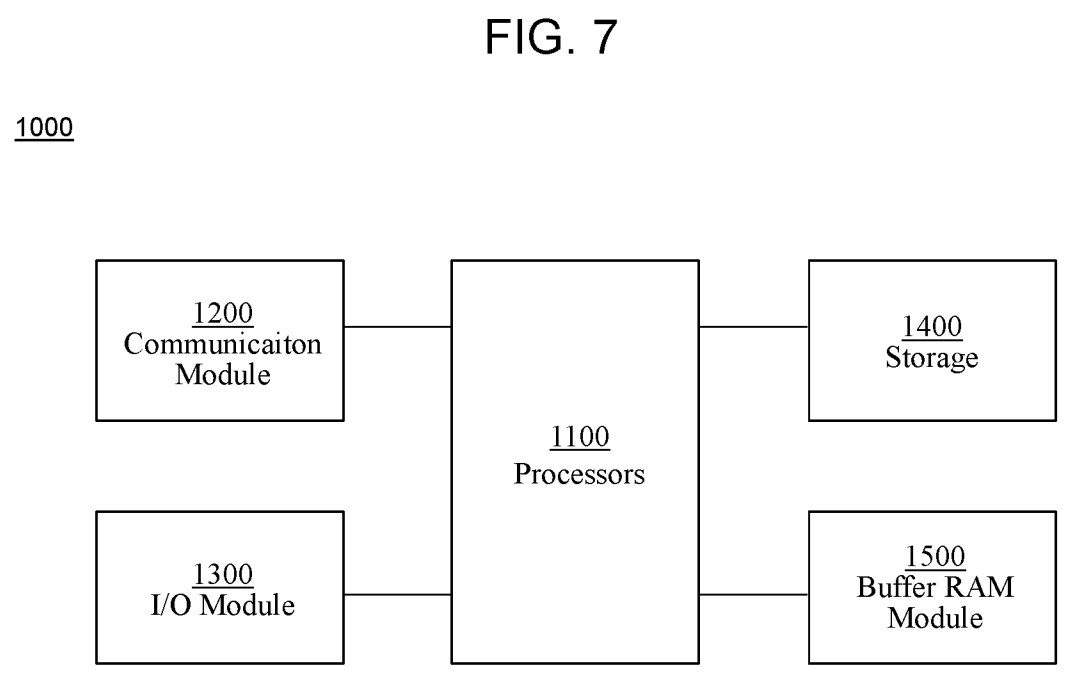

FIG. 7 is a schematic block diagram illustrating an electronic device including at least one of the semiconductor devices shown in FIGS. 2 and 3, according to embodiments.

Referring to FIG. 7, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 7, the electronic device 1000 may further include at least one sensor such as an image sensor.

At least one component in the electronic device 1000 may be formed based on at least one of the semiconductor devices shown in FIGS. 2 and 3, according to embodiments.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A semiconductor device comprising:

a $1^{st}$ source/drain region;

a $2^{nd}$ source/drain region;

a channel structure connecting the $1^{st}$ source/drain region to the $2^{nd}$ source/drain region;

a gate structure configured to control the channel structure;

a backside gate contact structure connected to a bottom surface of the gate structure;

a backside isolation structure at a lower portion of the semiconductor device;

a backside source/drain contact structure connected to a bottom surface of the $1^{st}$ source/drain region in the backside isolation structure;

a $1^{st}$ contact spacer on the backside source/drain contact structure, wherein the $1^{st}$ contact spacer is configured to isolate the backside source/drain contact structure from another circuit element in the backside isolation structure, and wherein the backside isolation structure is formed between the backside gate contact structure and the $1^{st}$ contact spacer and isolates the backside gate contact structure from the $1^{st}$ contact spacer.

2. The semiconductor device of claim 1, wherein the $1^{st}$ contact spacer is formed on a side surface of the backside source/drain contact structure, and comprises an isolation material.

3. The semiconductor device of claim 1, wherein the backside gate contact structure contacts the $1^{st}$ contact spacer.

4. The semiconductor device of claim 1, further comprising:

a placeholder structure connected to a bottom surface of the $2^{nd}$ source/drain region; and a $2^{nd}$ contact spacer on the placeholder structure, the $2^{nd}$ contact spacer isolating the placeholder structure from another circuit element in the backside isolation structure.

5. The semiconductor device of claim 4, wherein the $2^{nd}$ contact spacer comprises:

a side spacer on a side surface of the placeholder structure; and a bottom spacer on a bottom surface of the placeholder structure.

6. The semiconductor device of claim 4, further comprising a frontside source/drain contact structure connected to the $2^{nd}$ source/drain region.

7. The semiconductor device of claim 4, further comprising:

a backside gate contact structure connected to a bottom surface of the gate structure.

8. The semiconductor device of claim 7, wherein the backside gate contact structure is formed between the $1^{st}$ contact spacer and the $2^{nd}$ contact spacer.

9. A semiconductor device comprising:

a $1^{st}$ source/drain region;

a $2^{nd}$ source/drain region;

a channel structure connecting the $1^{st}$ source/drain region to the $2^{nd}$ source/drain region;

a gate structure configured to control the channel structure;

a backside isolation structure at a lower portion of the semiconductor device; and a backside gate contact structure connected to a bottom surface of the gate structure in the backside isolation structure, wherein the backside gate contact structure is misaligned with the bottom surface of the gate structure to be closer to the $2^{nd}$ source/drain region than the $1^{st}$ source/drain region, wherein a portion of the backside gate contact structure does not contact the bottom surface of the gate structure, and wherein the portion of the backside gate contact structure that does not contact the bottom surface of the gate structure contacts a bottom surface of an inner spacer formed between the gate structure and the $1^{st}$ source/drain region.

10. The semiconductor device of claim 9, wherein the backside gate contact structure is formed to be closer to the $1^{st}$ source/drain region than the $2^{nd}$ source/drain region.

11. The semiconductor device of claim 9, further comprising:

a backside source/drain contact structure connected to a bottom surface of the $1^{st}$ source/drain region; and a $1^{st}$ contact spacer on the backside source/drain contact structure, the $1^{st}$ contact spacer configured to isolate the backside source/drain contact structure from another circuit element in the backside isolation structure.

12. The semiconductor device of claim 11, wherein the backside gate contact structure contacts the $1^{st}$ contact spacer.

13. The semiconductor device of claim 12, further comprising:

a placeholder structure connected to a bottom surface of the $2^{nd}$ source/drain region; and a $2^{nd}$ contact spacer on the placeholder structure, the $2^{nd}$ contact spacer isolating the placeholder structure from another circuit element in the backside isolation structure.

14. The semiconductor device of claim 13, further comprising a frontside source/drain contact structure connected to the $2^{nd}$ source/drain region.

15. A method of manufacturing a semiconductor device, comprising:

forming a placeholder structure on a bottom surface of a source/drain region;

forming a contact spacer on the placeholder structure;

forming a backside gate contact structure on a bottom surface of a gate structure;

a backside isolation structure at a lower portion of the semiconductor device; and replacing the placeholder structure with a backside source/drain contact structure such that the backside source/drain contact structure is surrounded by the contact spacer, wherein the backside isolation structure is formed between the backside gate contact structure and the contact spacer and isolates the backside gate contact structure from the contact spacer.

* * * * *